(12) United States Patent
Sivaniah et al.

(10) Patent No.: US 12,259,650 B2
(45) Date of Patent: Mar. 25, 2025

(54) STRUCTURED NANOPOROUS MATERIALS, MANUFACTURE OF STRUCTURED NANOPOROUS MATERIALS AND APPLICATIONS OF STRUCTURED NANOPOROUS MATERIALS

(71) Applicant: KYOTO UNIVERSITY, Kyoto (JP)

(72) Inventors: Easan Sivaniah, Kyoto (JP); Masateru Ito, Kyoto (JP); Daisuke Yamamoto, Kyoto (JP)

(73) Assignee: KYOTO UNIVERSITY, Kyoto (JP)

( * ) Notice: Subject to any disclaimer, the term of this patent is extended or adjusted under 35 U.S.C. 154(b) by 1228 days.

(21) Appl. No.: 16/979,367

(22) PCT Filed: Mar. 13, 2019

(86) PCT No.: PCT/JP2019/010416
§ 371 (c)(1),
(2) Date: Sep. 9, 2020

(87) PCT Pub. No.: WO2019/177067
PCT Pub. Date: Sep. 19, 2019

(65) Prior Publication Data
US 2021/0003915 A1    Jan. 7, 2021

(30) Foreign Application Priority Data

Mar. 13, 2018   (GB) .................................... 1804010

(51) Int. Cl.
*B29C 35/08*   (2006.01)
*B29C 44/34*   (2006.01)
(Continued)

(52) U.S. Cl.
CPC ........ *G03F 7/0005* (2013.01); *B29C 35/0805* (2013.01); *B29C 44/3488* (2013.01);
(Continued)

(58) Field of Classification Search
CPC ............ B29C 35/0805; B29C 44/3488; B29C 2035/0838; B29K 2105/04; B29K 2105/24
(Continued)

(56) References Cited

U.S. PATENT DOCUMENTS 6,358,653 B1   3/2002   Turberfield et al.
6,565,763 B1   5/2003   Asakawa et al.
(Continued)

FOREIGN PATENT DOCUMENTS

JP    3233883 B2    12/2001
JP   2009190202 A    8/2009
(Continued)

OTHER PUBLICATIONS

Albuquerque, Pedro P.A.C. et al., "Degree of Conversion, Depth of Cure, and Color Stability of Experimental Dental Composite Formulated with Camphorquinone and Phenanthrenequinone Photoinitiators", Journal of Esthetic and Restorative Dentistry, vol. 27, No. SI S49-S57 (2015).

(Continued)

*Primary Examiner* — Jeffrey M Wollschlager
*Assistant Examiner* — Xue H Liu
(74) *Attorney, Agent, or Firm* — CANTOR COLBURN LLP

(57) ABSTRACT

A method is disclosed for manufacturing a structured polymeric material. In the method, a body is provided comprising a substantially homogenous precursor polymeric material. An interference pattern of electromagnetic radiation is set up within the body to form a partially cross-linked polymeric material, the interference pattern comprising maxima and minima of intensity of the electromagnetic radiation, the interference pattern thereby causing spatially differential cross linking of the precursor polymeric material (Continued)

to form crosslinked regions having relatively high cross linking density and non-crosslinked regions having relatively low cross linking density, the crosslinked regions and non-crosslinked regions corresponding to the maxima and minima of intensity of the electromagnetic radiation, respectively. The partially cross-linked polymeric material is then contacted with a solvent to cause expansion and crazing of at least some of the non-crosslinked regions to form a structured polymeric material containing pores.

11 Claims, 19 Drawing Sheets

(51) Int. Cl.
<table>
<tr><td>C08J 3/24</td><td>(2006.01)</td></tr>
<tr><td>C08J 3/28</td><td>(2006.01)</td></tr>
<tr><td>C08J 7/02</td><td>(2006.01)</td></tr>
<tr><td>G02B 1/00</td><td>(2006.01)</td></tr>
<tr><td>G03F 7/00</td><td>(2006.01)</td></tr>
<tr><td>G03F 7/20</td><td>(2006.01)</td></tr>
<tr><td>B29K 25/00</td><td>(2006.01)</td></tr>
<tr><td>B29K 105/04</td><td>(2006.01)</td></tr>
<tr><td>B29K 105/24</td><td>(2006.01)</td></tr>
<tr><td>B42D 25/29</td><td>(2014.01)</td></tr>
<tr><td>B42D 25/328</td><td>(2014.01)</td></tr>
<tr><td>B42D 25/41</td><td>(2014.01)</td></tr>
</table>

(52) U.S. Cl.
CPC .............. *C08J 3/245* (2013.01); *C08J 3/28* (2013.01); *C08J 7/02* (2013.01); *G02B 1/005* (2013.01); *G03F 7/2053* (2013.01); *B29C 2035/0838* (2013.01); *B29K 2025/06* (2013.01); *B29K 2105/04* (2013.01); *B29K 2105/24* (2013.01); *B42D 25/29* (2014.10); *B42D 25/328* (2014.10); *B42D 25/41* (2014.10); *C08J 2325/06* (2013.01); *G02B 2207/101* (2013.01)

(58) Field of Classification Search
USPC .......................................................... 264/54
See application file for complete search history.

(56) References Cited

U.S. PATENT DOCUMENTS

<table>
<tr><td>2006/0286488 A1</td><td>12/2006</td><td>Rogers et al.</td><td></td></tr>
<tr><td>2007/0282030 A1</td><td>12/2007</td><td>Anderson et al.</td><td></td></tr>
<tr><td>2013/0180920 A1*</td><td>7/2013</td><td>Sivaniah</td><td>B01D 67/003<br>210/500.21</td></tr>
<tr><td>2014/0162033 A1*</td><td>6/2014</td><td>Giller</td><td>B33Y 10/00<br>428/209</td></tr>
<tr><td>2015/0248060 A1</td><td>9/2015</td><td>Amano</td><td></td></tr>
</table>

FOREIGN PATENT DOCUMENTS

<table>
<tr><td>JP</td><td>4581377 B2</td><td>11/2010</td></tr>
<tr><td>JP</td><td>201383766 A</td><td>5/2013</td></tr>
<tr><td>WO</td><td>2008047514 A1</td><td>4/2008</td></tr>
<tr><td>WO</td><td>2012035292 A2</td><td>3/2012</td></tr>
</table>

OTHER PUBLICATIONS

Allen, N.S., "Photoinitiators for UV and visible curing of coatings mechanisms and properties", J. Photochem. Photobiol. A Chem. 100, 101-107 (1996).

Arencon, David et al., "Fracture Toughness of Polypropylene-Based Particulate Composites", Materials 2009, 2 (4), 2046-2094.

Campbell, M. et al., "Fabrication of photonic crystals for the visible spectrum by holographic lithograph", Nature. 404, 53-6 (2000).

Crivello, J.V. et al., "Photopolymer Materials and Processes for Advanced Technologies", Chem. Mater. 26, 533-548 (2014).

Cui, B., slides for University of Waterloo course NE 343 Microfabrication and thin film technology, Ch. 5.Lithography, Section 4: Resolution, depth of focus, modulation transfer function, retrieved from the internet Sep. 25, 2020 from URL http://slideplayer.com/slide/3826860/ (10 pages).

Derosa, Michael E. et al., "Microtextured Polystyrene Surfaces for Three-Dimensional Cell Culture Made by a Simple Solvent Treatment Method", J. Appl. Polym. Sci., in press, doi10.1002app.40181.

Desai, Chaitanya K. et al., "Measurement of Cohesive Parameters of Crazes in Polystyrene Films", Experimental and Applied Mechanics, T.Proulx (ed.), vol. 6 DOI10.1007/978-1-4614-0222-0_62 2011, S19-S25.

Geissler, M. et al., "Patterning Principles and Some New Developments", Adv. Mater. 16, 1249-1269 (2004).

Hansen, Charles M. et al., Prediction of Environmental Stress Cracking in Plastics with Hansen Solubility Parameters, Ind. Eng. Chem. Res. 2001, 40 pp. 21-25.

Hansen, Charles M., On predicting environmental stress cracking in polymer', Polymer Degradtion and Stability 77, 43-53 (2002).

Hwang, S. H. et al., "A novel organic bottom anti-reflective coating material for 193 nm excimer laser lithography", Polymer 41 (2000) pp. 6691-6694.

International Search Report for International Application No. PCT/JP2019/010416 filed Mar. 13, 2019; Date of Mailing: Jun. 18, 2019; 3 pages.

Jeon, S. et al., "Fabricating complex three-dimensional nanostructures with high-resolution conformable phase masks", Proc. Natl. Acad. Sci. 101, 12428-12433 (2004).

Kambour, R. P., "A Review of Crazing and Fracture in Thermoplastics", J. Polym. Sci. Macromol. Rev. 7, 1-154 (1973).

Kang, Pilgyu, "High Resolution Reversible Color Images on Photonic Crystal Substrates", Langmuir. 27, 9676-9680 (2011).

Korka, J.E., Standing Waves in Photoresists. Appl. Opt. 9, 969 (1970), 2 Pages.

Lee, Hye Soo, et al., "Colloidal Photonic Crystals Toward Structural Color Palettes for Security Materials", Chem. Mater. 2013, 25, 2684-2690.

Mao, P. et al., Fabrication and characterization of 20 nm planar nanofluidic channels by glass-glass and glass-silicon bonding. Lab Chip. 5, 837 (2005).

McGarel, Owen J. et al., "Craze Growth and Healing in Polystyrene", J. Polym. Sci. Part B Polym. Phys. 25, 2541-2560 (1987).

Park, S.-G et al., "Cu(2)O inverse woodpile photonic crystals by prism holographic lithography and electrodeposition", Adv. Mater. 23, 2749-52 (2011).

Rottler, Jorg, et al., "Growth, microstructure, and failure of crazes in glassy polymers", Phys. Rev. E. 68, 11801 (2003).

Sackmann, E.K. et al., "The present and future role of microfluidics in biomedical research", Nature. 507, 181-189 (2014).

Sia, S.K. et al., "Microfluidic devices fabricated in poly(dimethylsiloxane) for biological studies", Electrophoresis. 24, 3563-3576 (2003).

Smirnov, Jose R.C., et al., "Adaptable Ultraviolet Reflecting Polymeric Multilayer Coatings of High Refractive Index Contrast", Adv. Opt. Mater. 3, 1633-1639 (2015).

Tsukahara, Takehiko et al., "Integrated extended-nano chemical systems on a chip", Chem. Soc. Rev. 39, 1000 (2010).

Widmann, Dietrich W., et al., "Linewidth Variations in Photoresist Patterns on Profiled Surfaces" IEEE Trans. Electron Devices. 22, 467-471 (1975).

Written Opinion of the International Searching Authority for International Application No. PCT/JP2019/010416 filed Mar. 13, 2019; Date of Mailing: Jun. 18, 2019; 4 Pages.

Xiaowei, Z. et al., "Li-ion Battery Separators, Mechanical Integrity and Failure Mechanisms Leading to Soft and Hard Internal Shorts", Scientific Reports, 6, 32578, doi: 10.1038/srep32578 (2016) pp. 1-9.

(56) References Cited

OTHER PUBLICATIONS

Zavala-Rivera, P. et al., "Collective osmotic shock in ordered material", Nat. Mater. 11, 53-57 (2012).

* cited by examiner

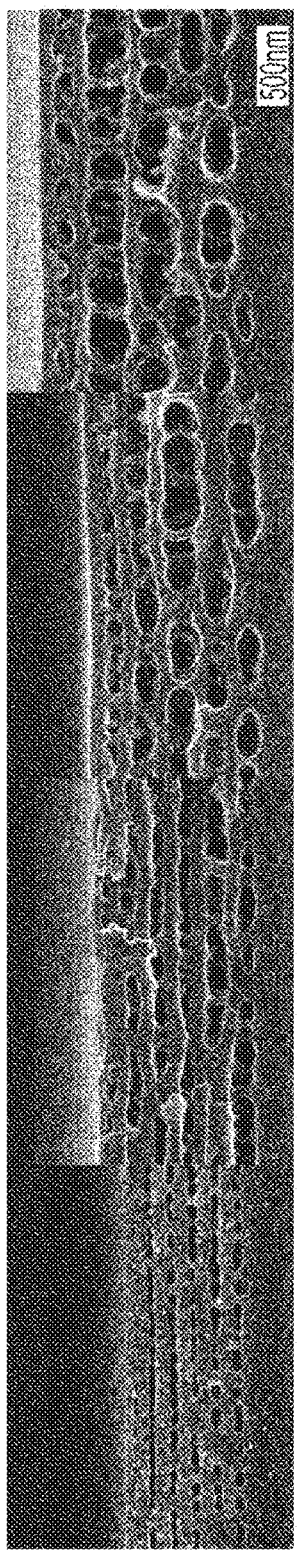
[Fig. 1]

[Fig. 2]
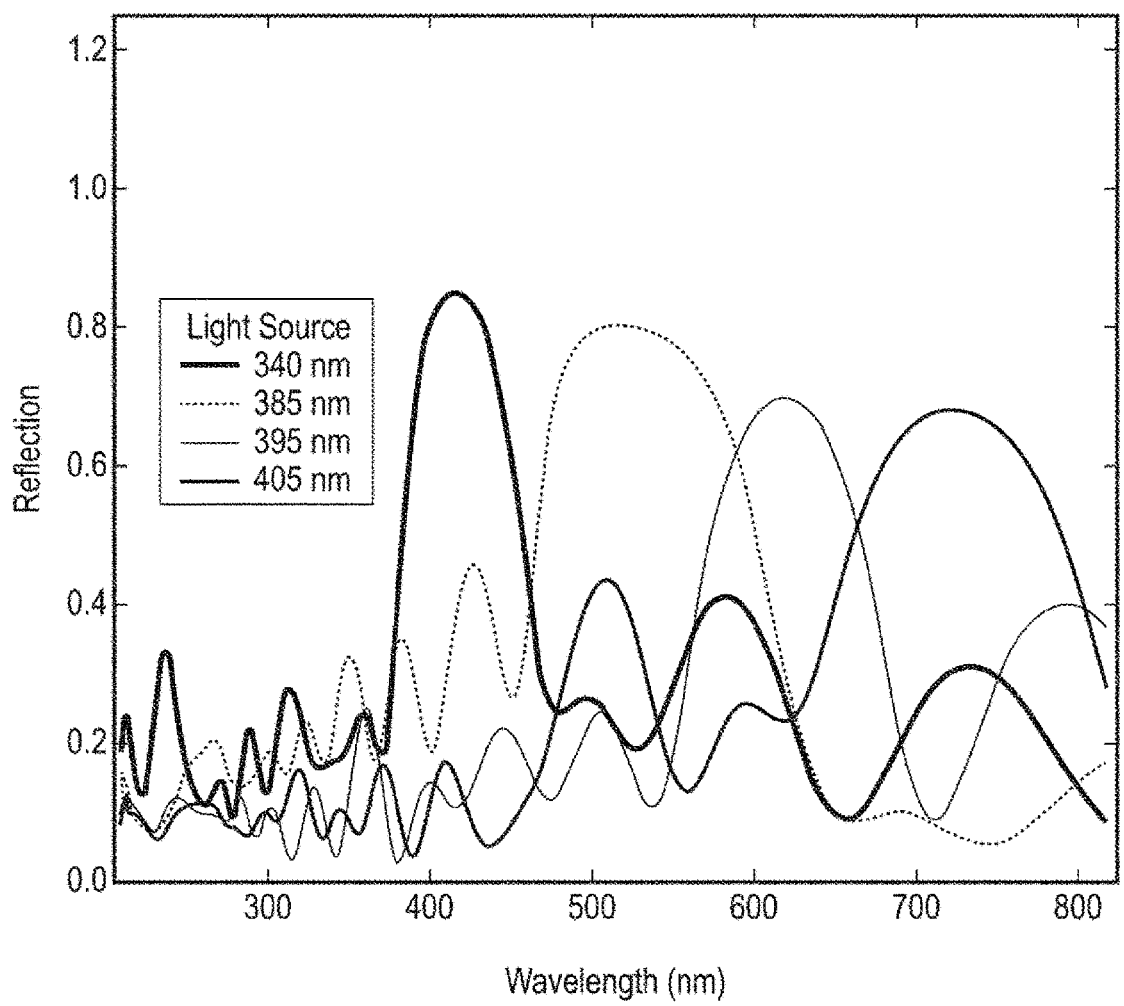

[Fig. 3]
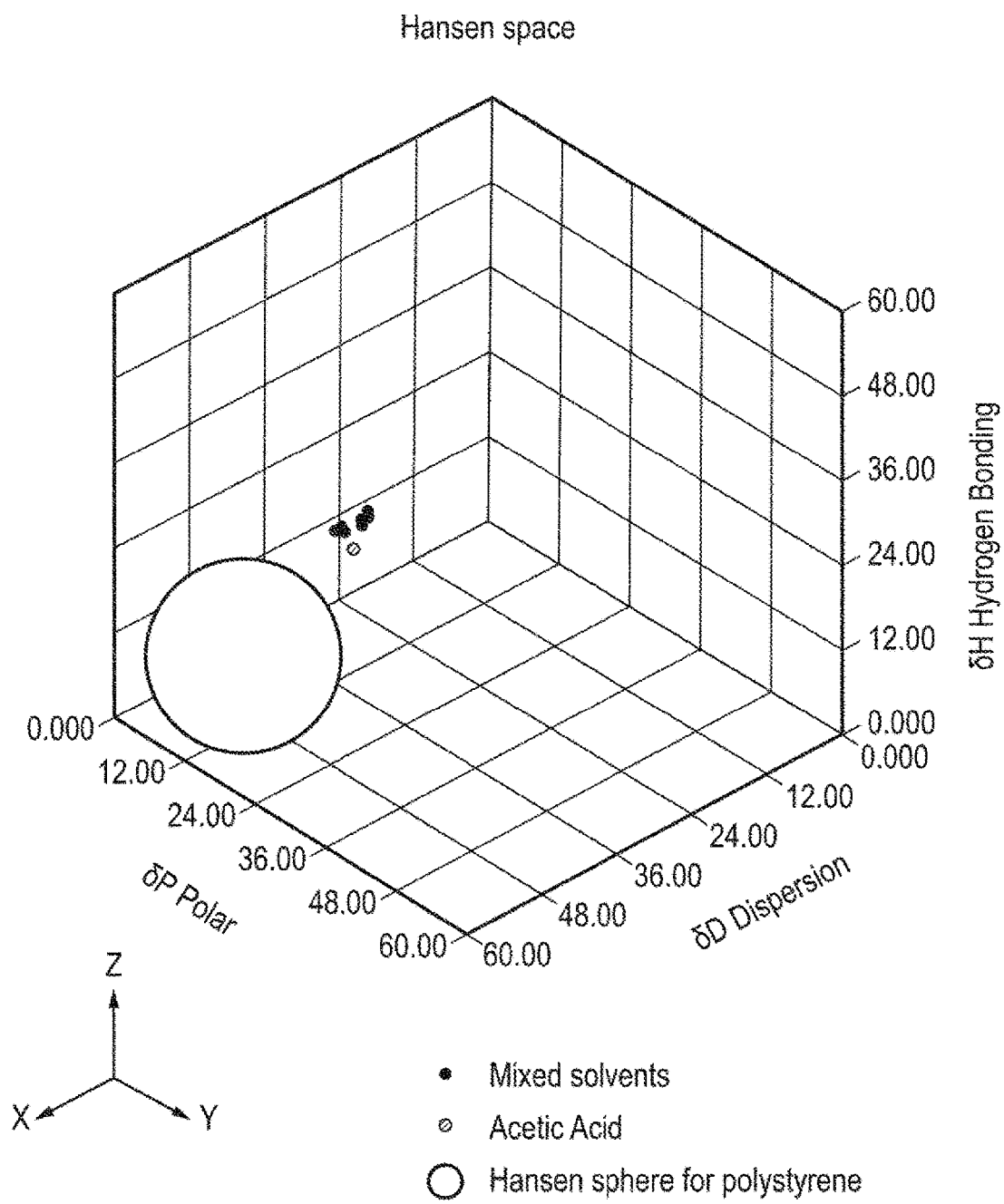

[Fig. 4]
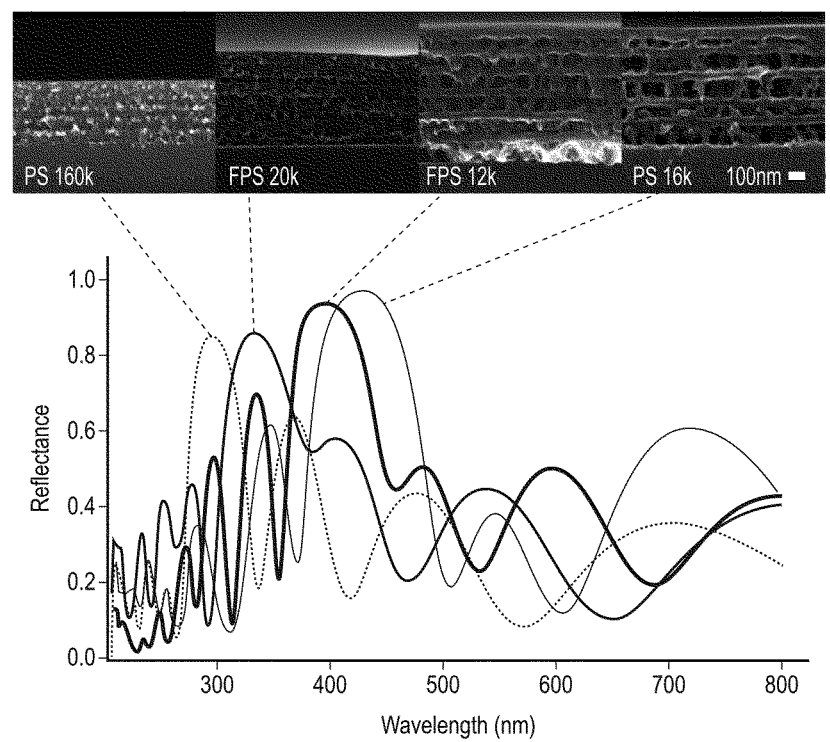
[Fig. 5]
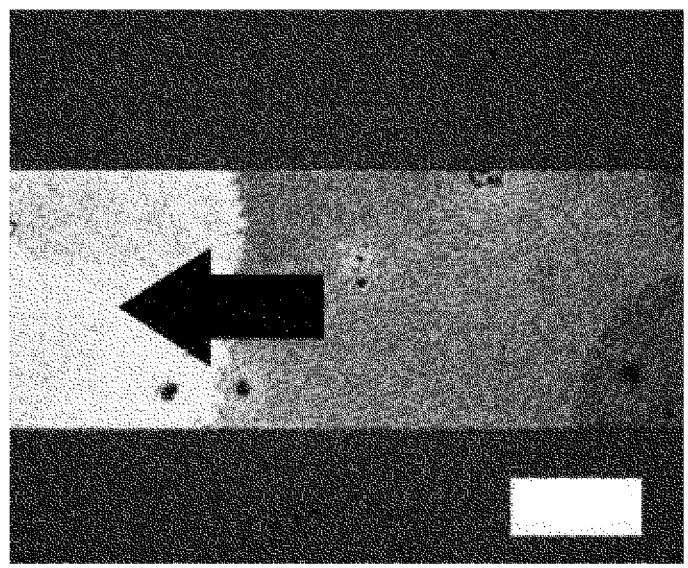

[Fig. 6]
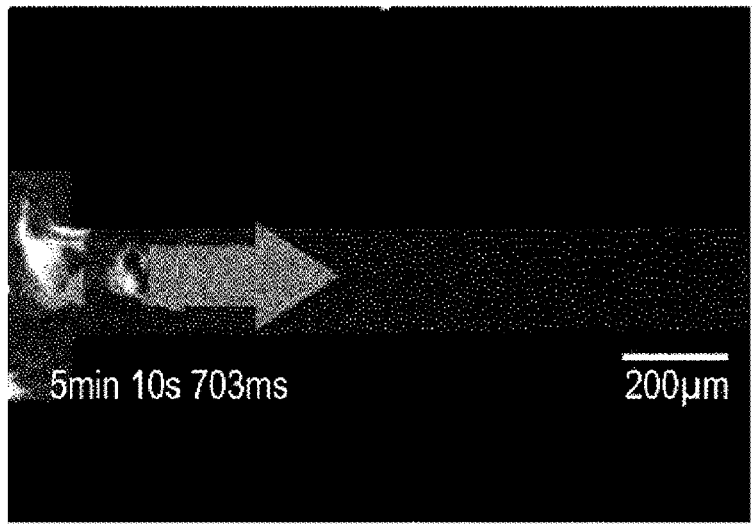
[Fig. 7]
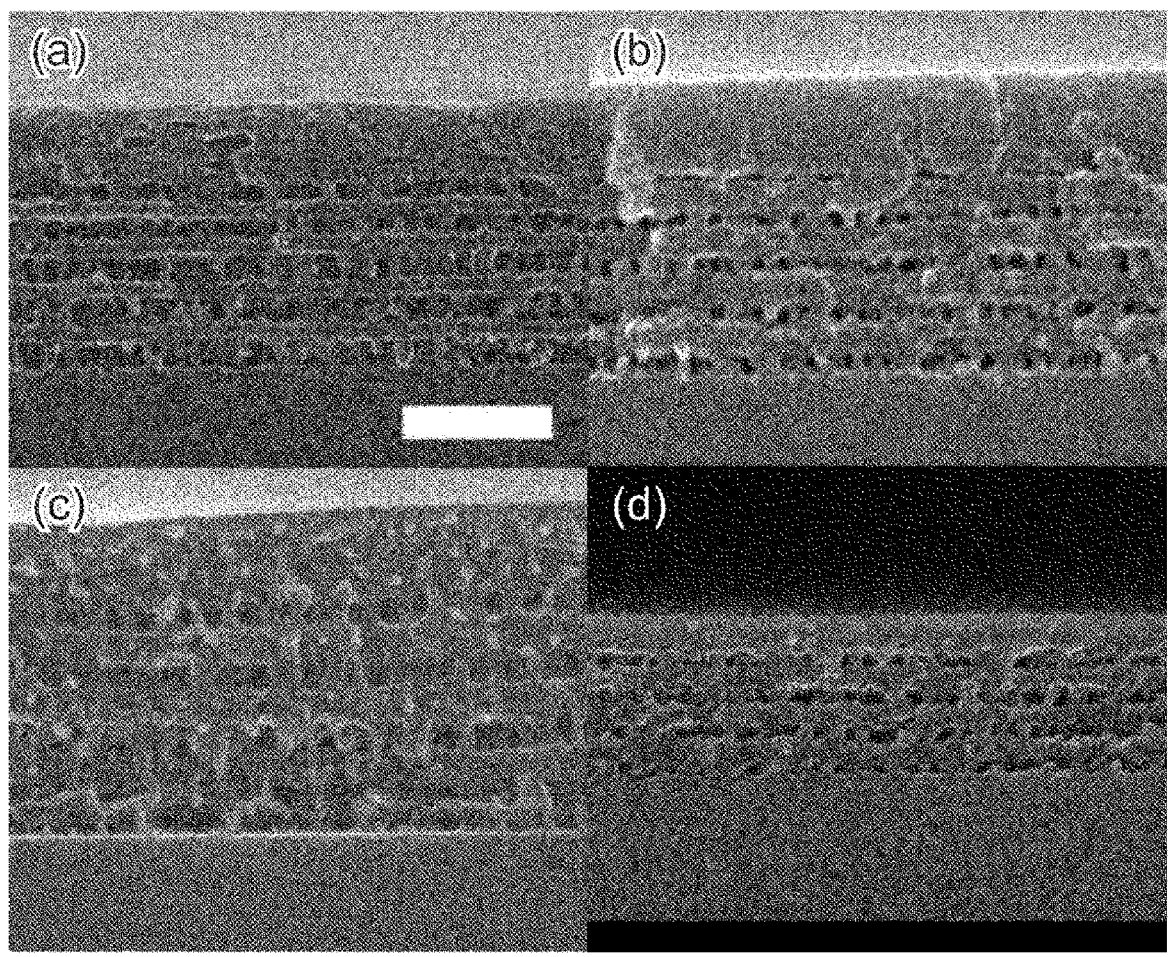

[Fig. 8]
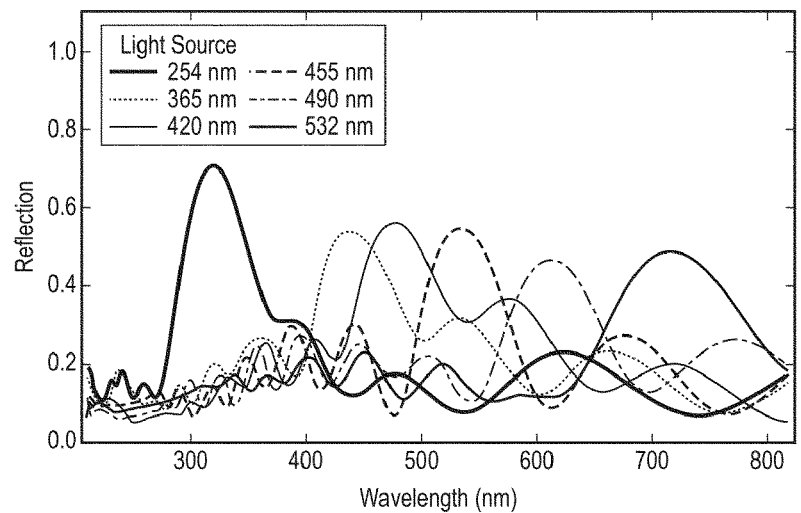
[Fig. 9]
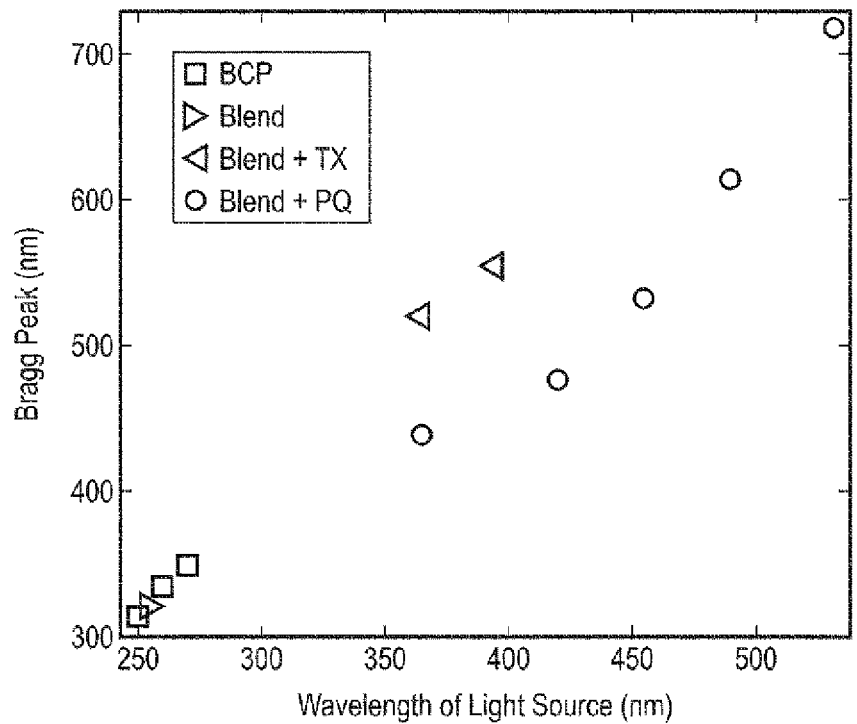

[Fig. 10]
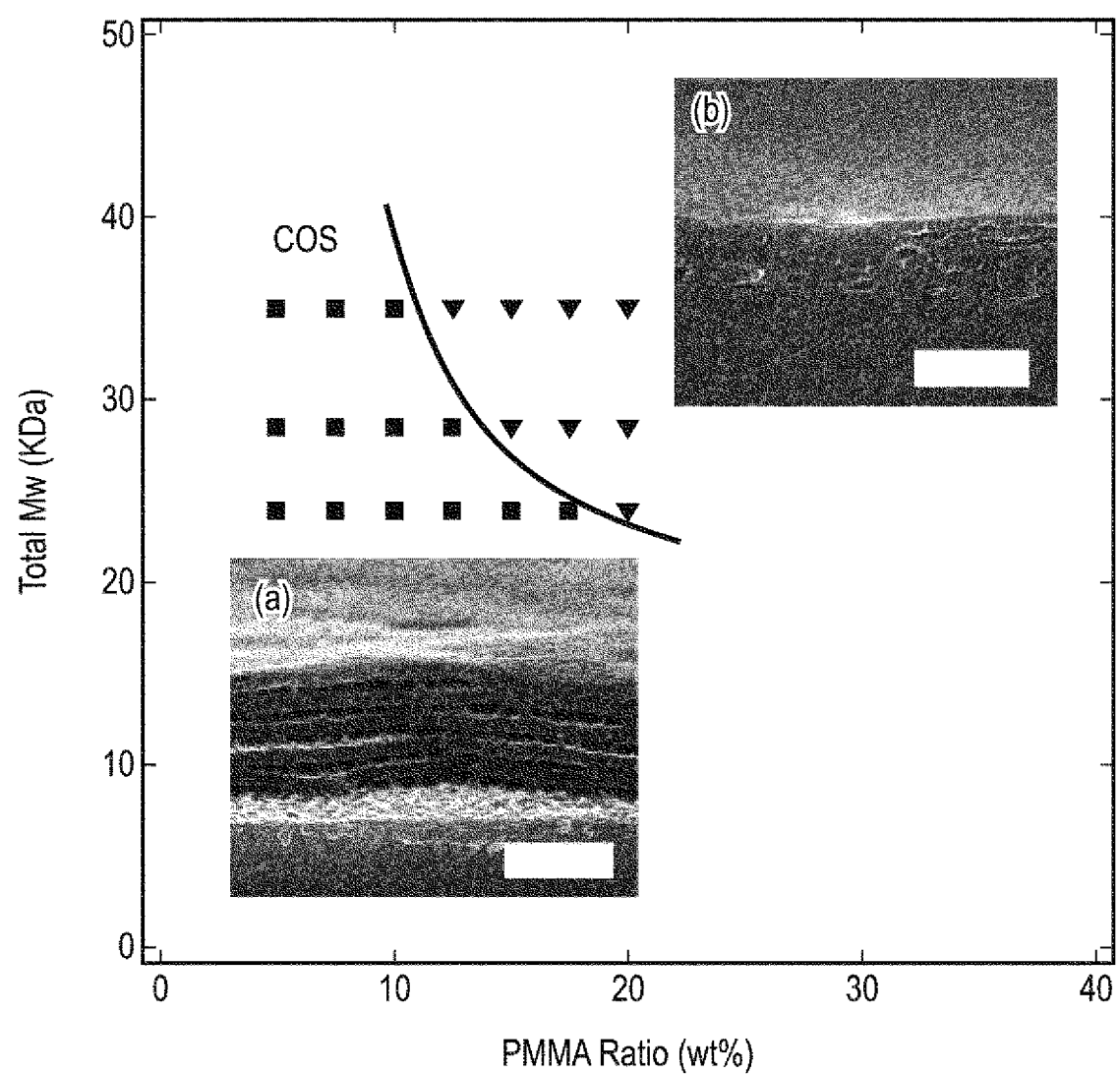

[Fig. 11]
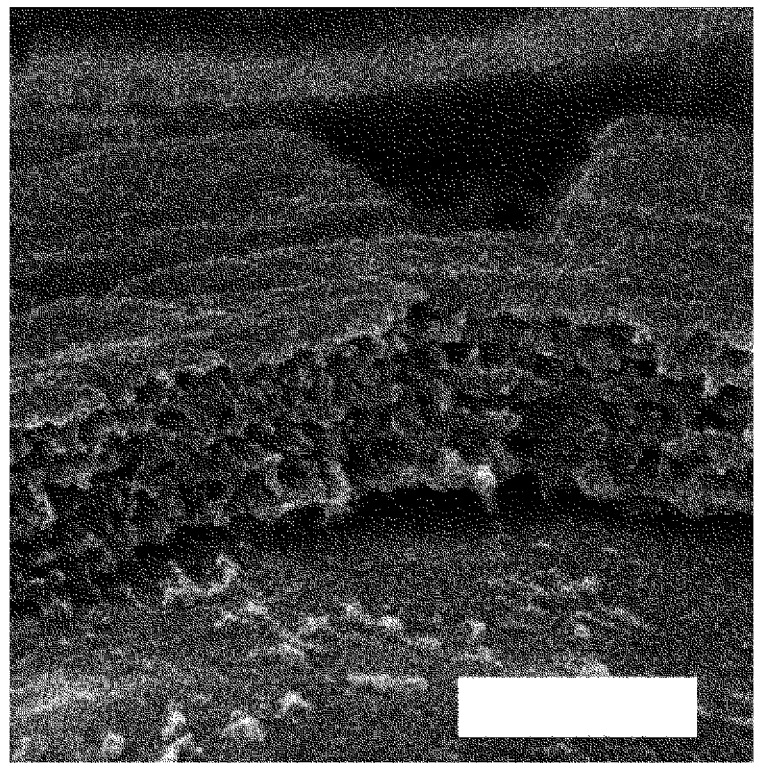
[Fig. 12]
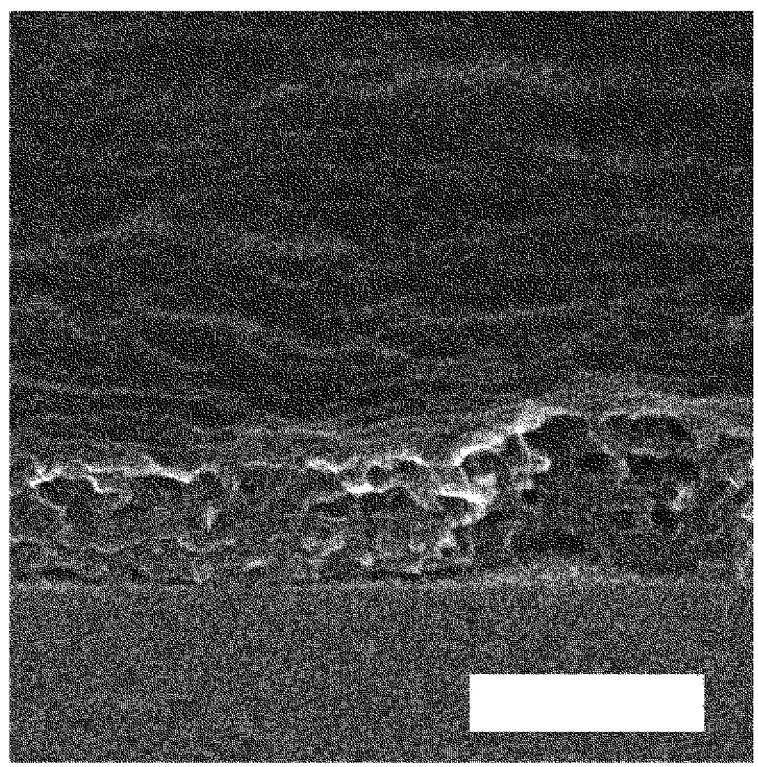

[Fig. 13]
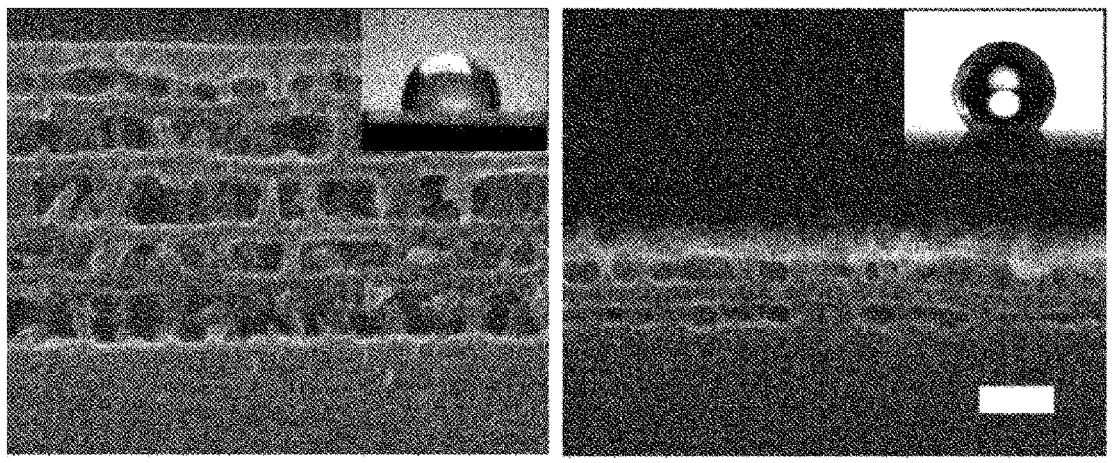
[Fig. 14]
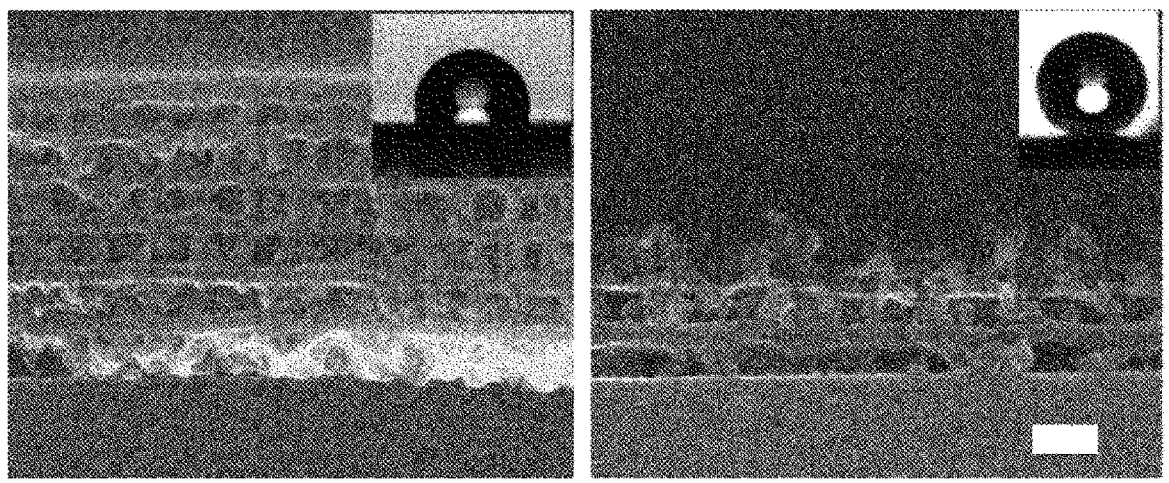
[Fig. 15]
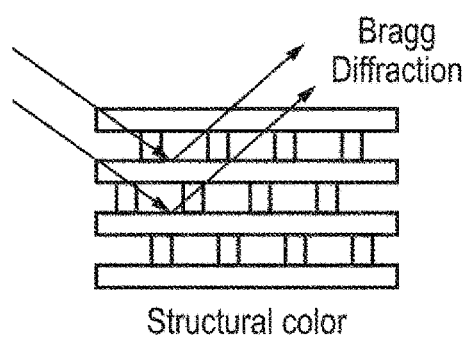

[Fig. 16]
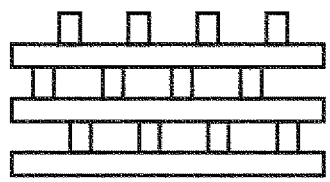
Superhydrophobic and anti-frosting
[Fig. 17]
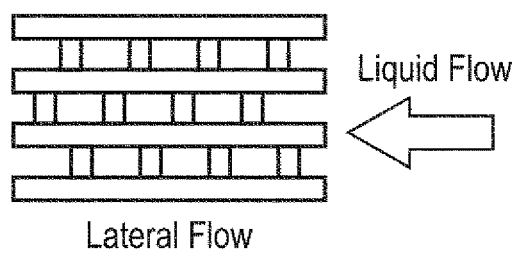
Liquid Flow
Lateral Flow

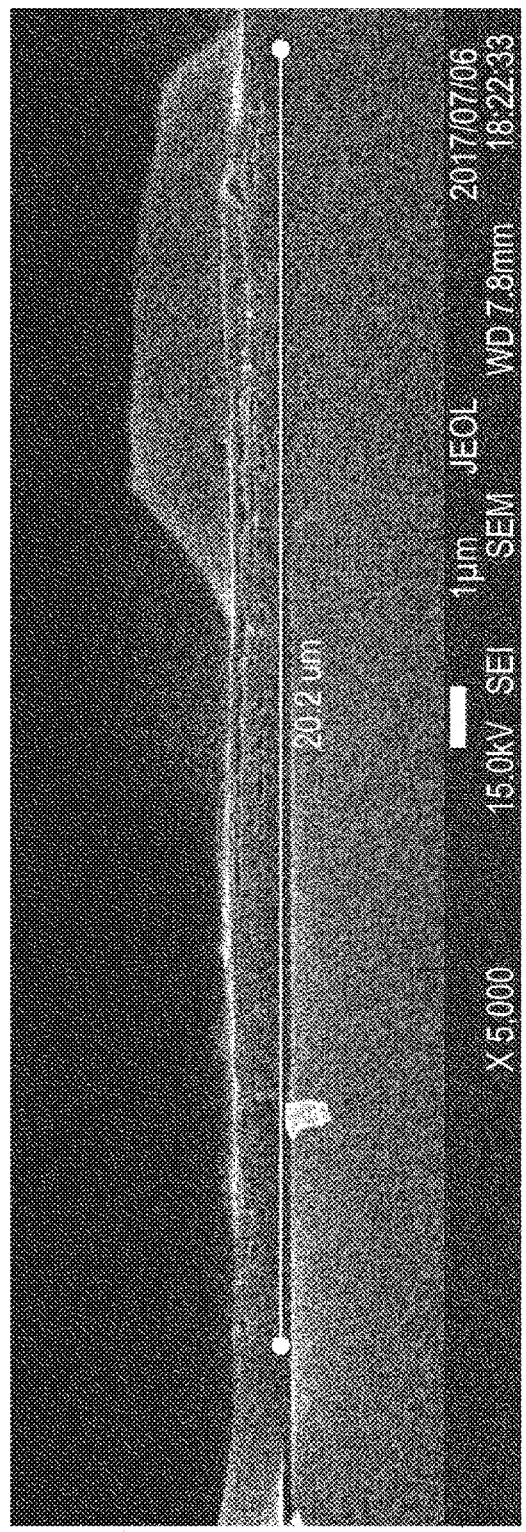
[Fig. 18]

[Fig. 19]
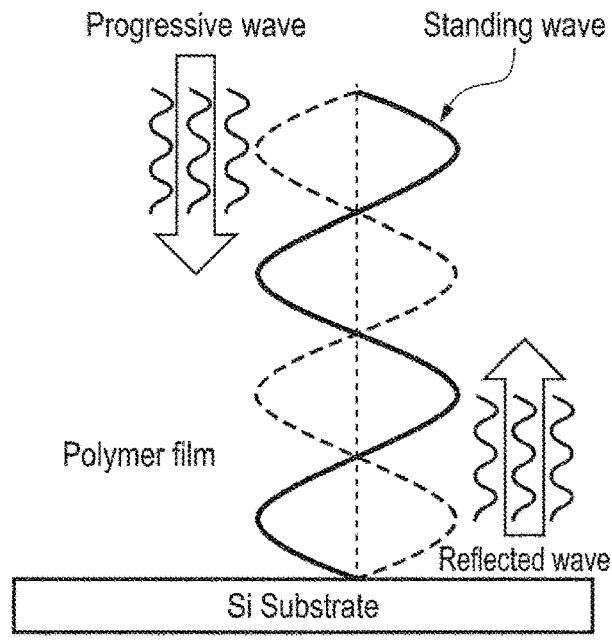
[Fig. 20]
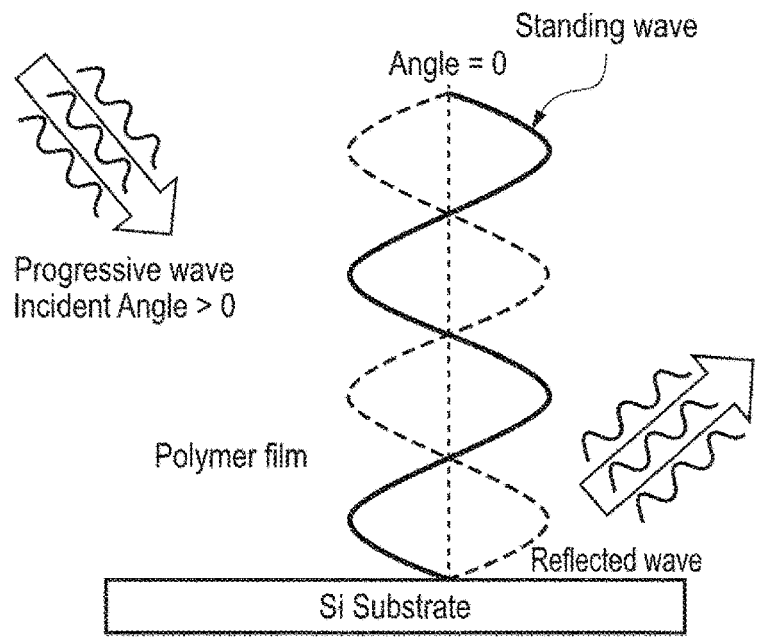
[Fig. 21]
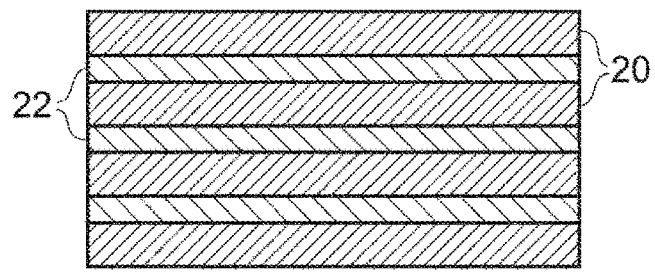

[Fig. 22]
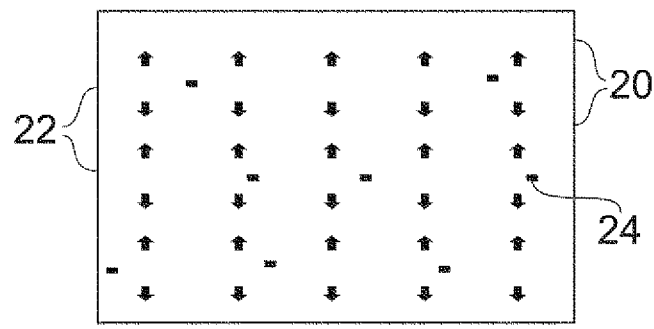
[Fig. 23]
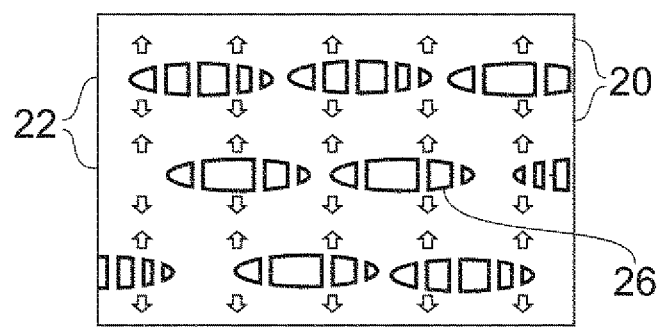
[Fig. 24]
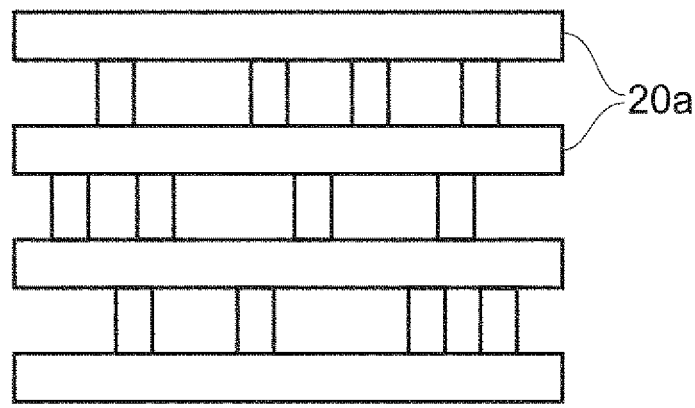

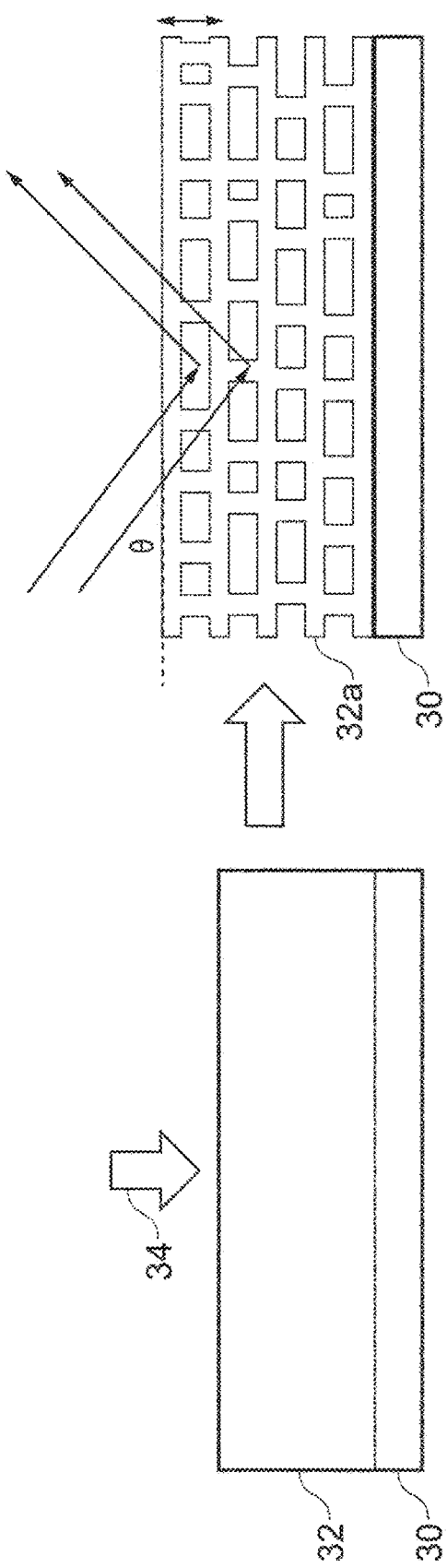
[Fig. 25]

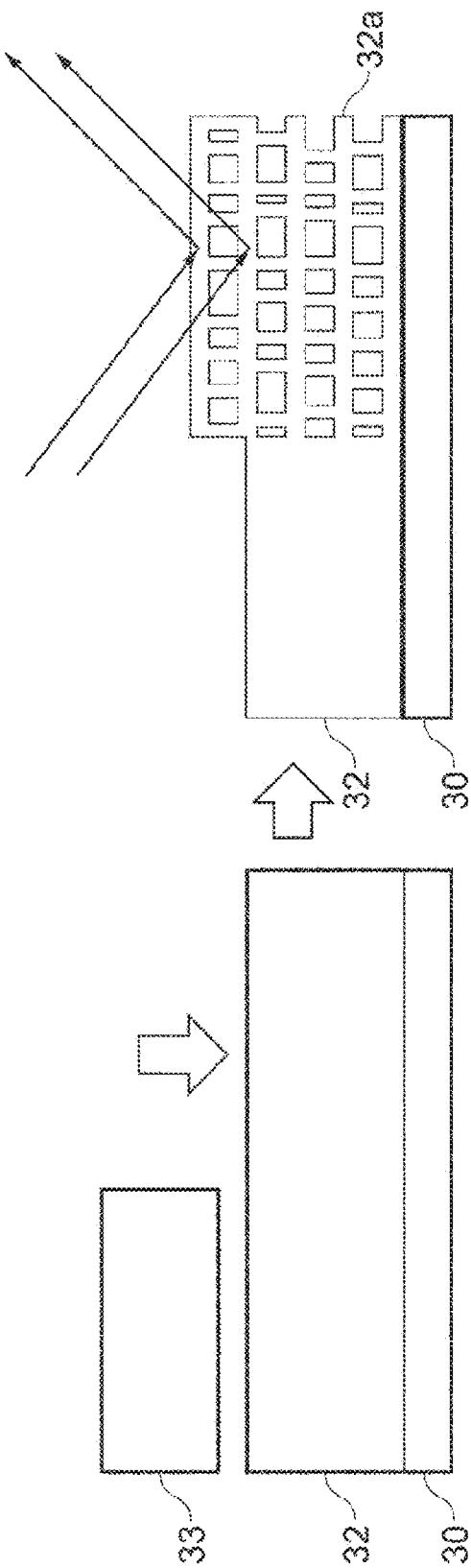
[Fig. 26]

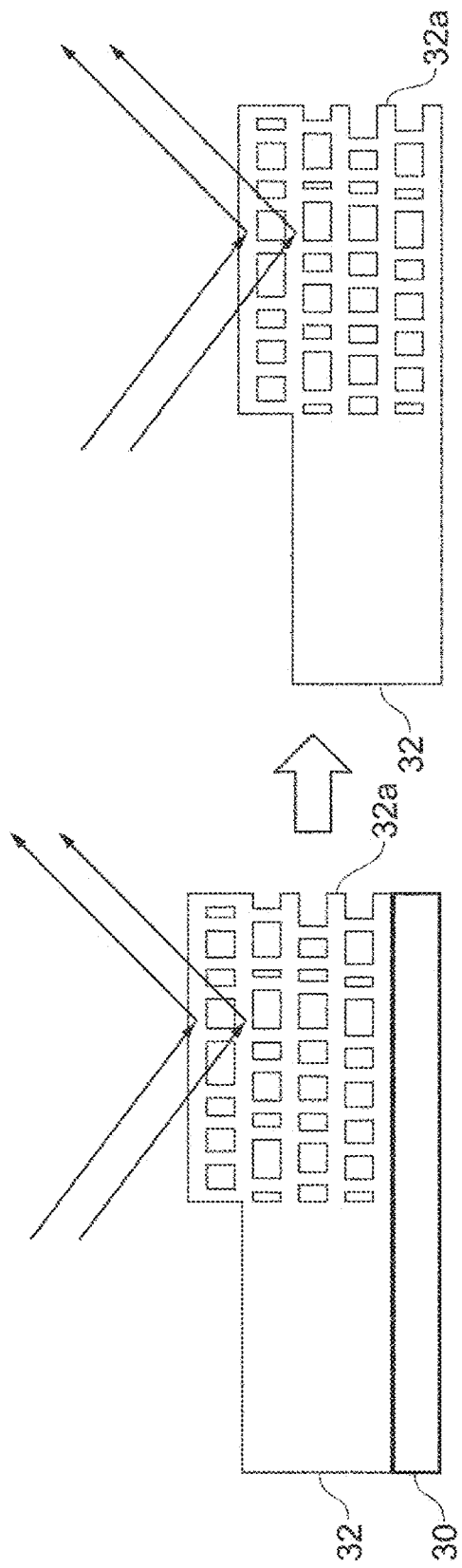

[Fig. 28]
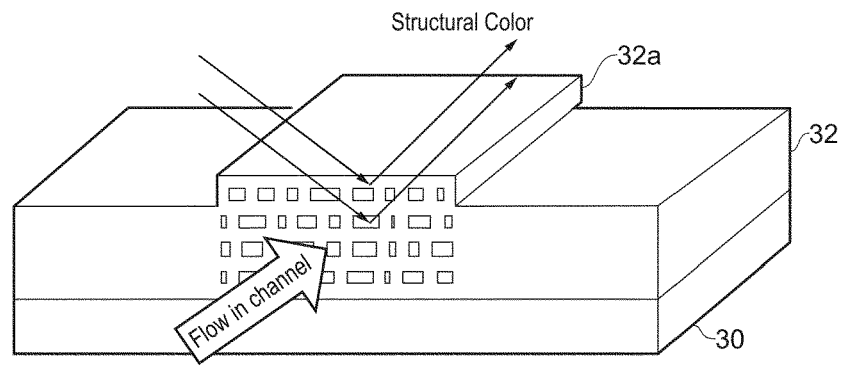
[Fig. 29]
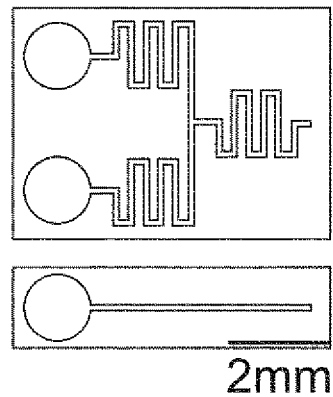
[Fig. 30]
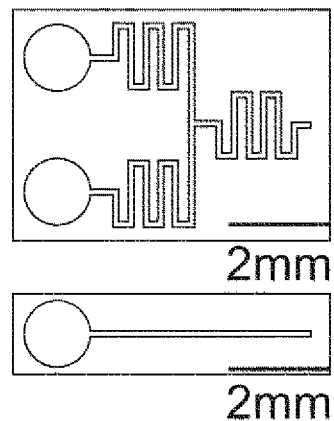

[Fig. 31]
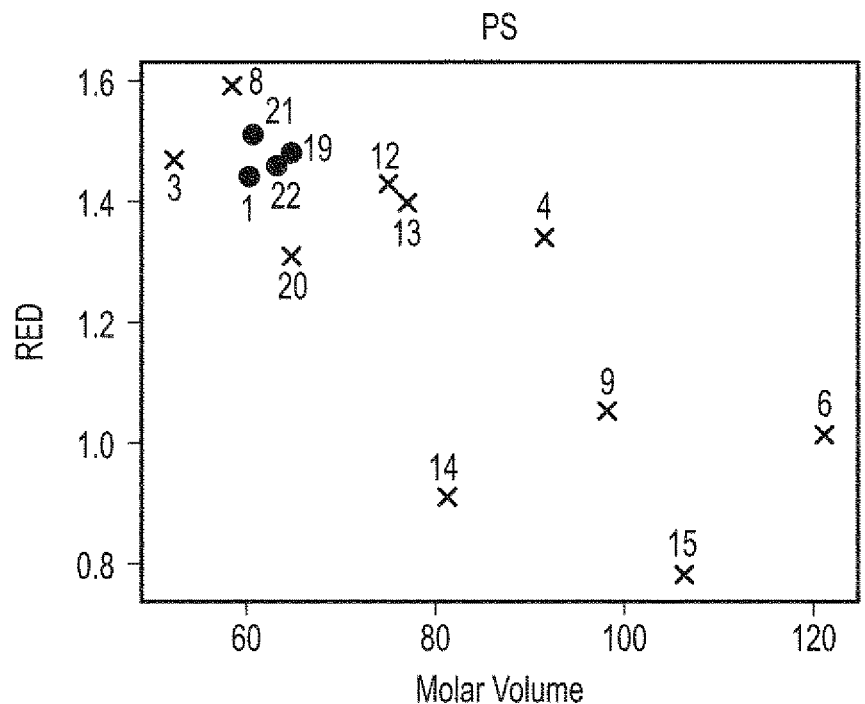
[Fig. 32]
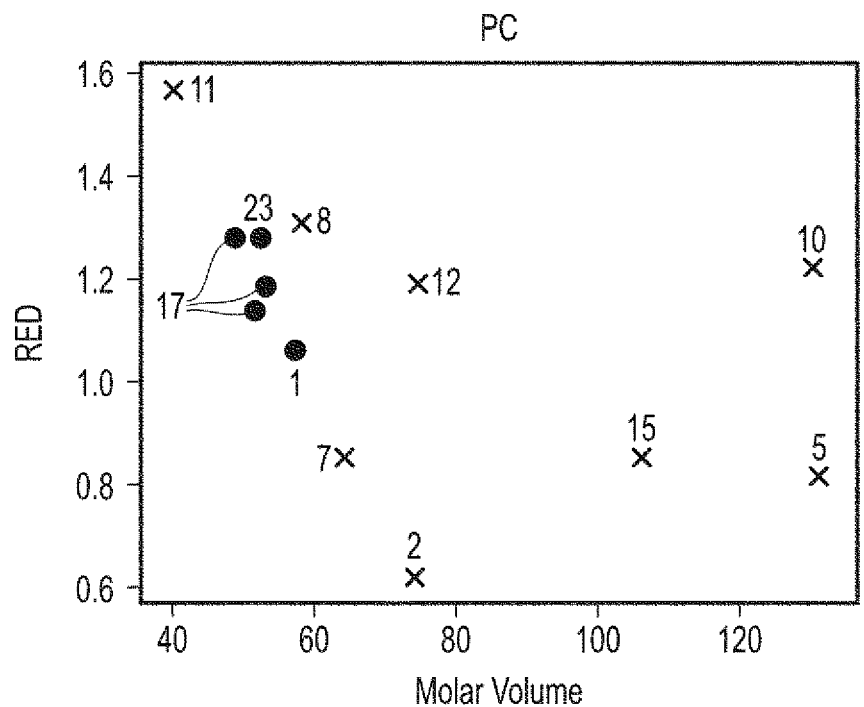

[Fig. 33]
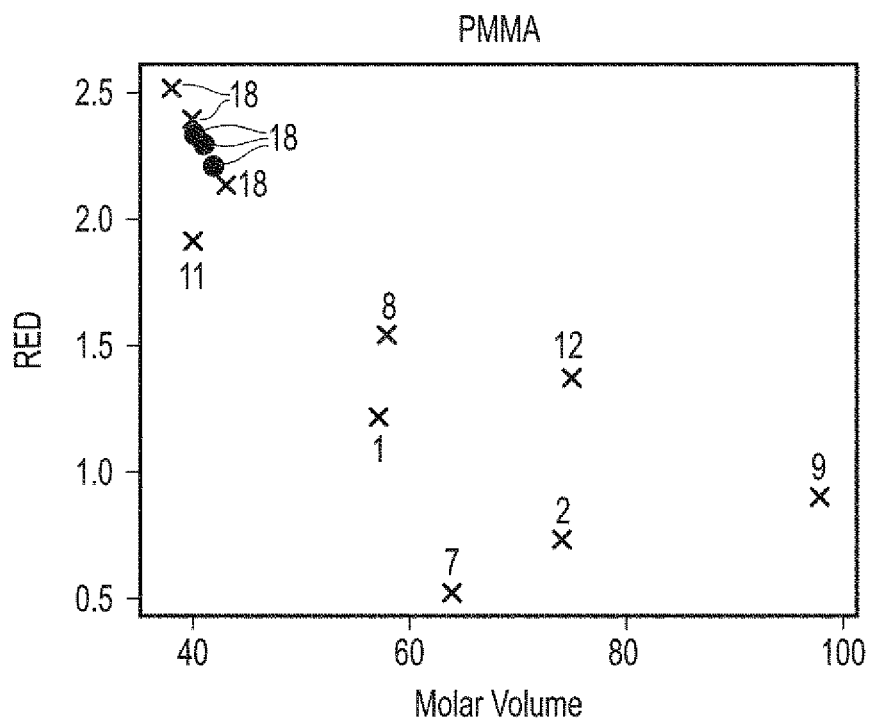
[Fig. 34]
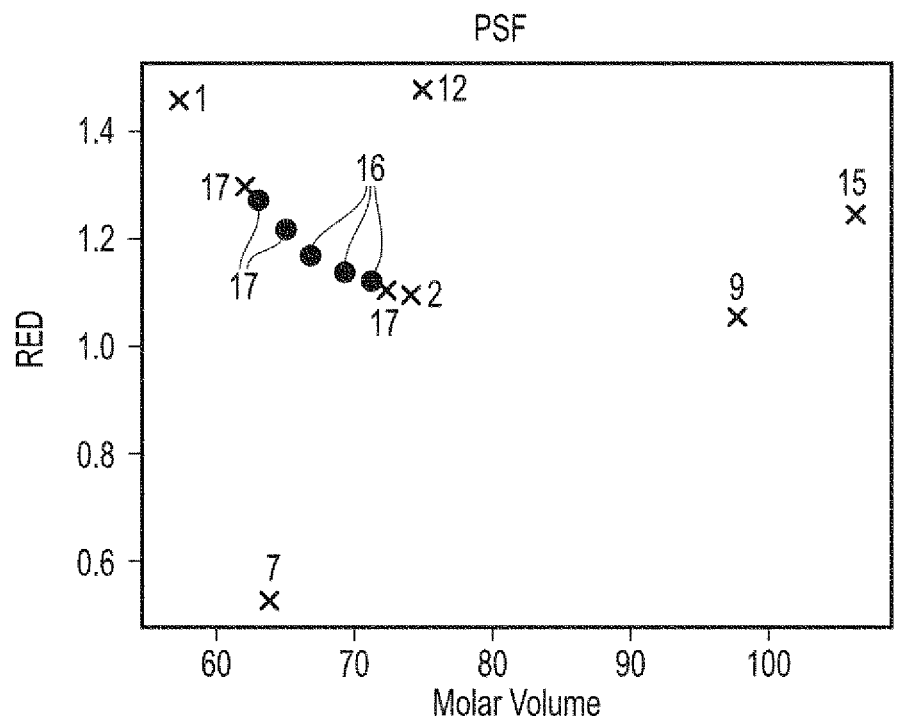

STRUCTURED NANOPOROUS MATERIALS, MANUFACTURE OF STRUCTURED NANOPOROUS MATERIALS AND APPLICATIONS OF STRUCTURED NANOPOROUS MATERIALS

CROSS REFERENCE TO RELATED APPLICATIONS

This application is a National Stage application of PCT/JP2019/010416, filed Mar. 13, 2019, which claims the benefit of Application No. GB 1804010.5, filed on Mar. 13, 2018, both of which are incorporated by reference in their entirety herein.

TECHNICAL FIELD

Background to the Invention

Field of the Invention

The present invention relates to structured nanoporous materials, methods for the manufacture of structured nanoporous materials and applications of structured nanoporous materials. Such materials have utility in various technical fields, particularly, but not exclusively, in optical technology such as for anti-counterfeiting measures, and in microfluidic technology such as for diagnostic applications.

BACKGROUND ART

Related Art

The present disclosure is a development of the disclosure of WO 2012/035292. In WO 2012/035292, there is disclosed a process for the manufacture of a porous material. The porosity is developed based on phase separation of block copolymers, specifically PS-b-PMMA. After phase separation and cross-linking, a process termed "collective osmotic shock" is used to cause selective removal of one phase using a solvent. In WO 2012/035292, there is also disclosed a special morphology of the porous material in which there are relatively dense lamellae separated by relatively porous layers, which can be considered to be a periodically stratified porous structure. A similar disclosure is set out in Ref. 7.

A mechanism for the formation of the lamellar morphology disclosed in Ref. 7 was explained in Ref. 8. In Ref. 8, it is disclosed that the phase separation of the PS and PMMA components is allowed to proceed as in WO 2012/035292 by annealing. Subsequently, UV light is used to cross-link the PS component of the block copolymer. The UV light is reflected from the surface of a substrate on which the block copolymer layer is deposited. This reflection sets up a periodic interference pattern in the layer, with the dense lamellae corresponding to the maxima of the UV light in the interference pattern, and the porous layers corresponding to the minima. The spacing of the dense lamellae therefore corresponds to the periodic interference pattern formed in the layer.

CITATION LIST

Patent Literature

[PTL 1] WO2012/035292

SUMMARY OF INVENTION

Technical Problem

Summary of the Invention

At the time of developing the technology disclosed in Ref. 8, the present inventors considered that it was essential to the development of the characteristic periodically stratified porous structure first to form an ordered, phase separated structure. Specifically, in Ref. 8 as in WO 2012/035292, it is necessary to use a block polymer material in order to form a heterogeneous morphology comprising a three dimensional array of isolated islands in a continuous matrix, the islands being formed of an island component of the block copolymer and the matrix being formed of a matrix component of the block copolymer.

However, the need to develop a phase separated heterogeneous morphology (which in turn requires the use of block copolymers) is considered by the present inventors to be a serious restriction on the potential applications of this technology. Block copolymers are relatively expensive and there is only a relatively narrow compositional range of suitable block copolymers that show the required phase separation behaviour and differential cross linking capability in order to develop the specific microstructure reported in WO 2012/035292 and in Refs. 7 and 8. Furthermore, the step of phase separation is a specific step in the process disclosed in WO 2012/035292 and in Refs. 7 and 8 (promoted by annealing of the deposited block copolymer layer) and it would be advantageous to omit the need for this step, in order to improve manufacturing efficiency for forming these advanced porous materials.

The present invention has been devised in order to address at least one of the above problems. Preferably, the present invention reduces, ameliorates, avoids or overcomes at least one of the above problems.

In particular, the present inventors have realised that it may be possible to form similar microstructures to those reported in WO 2012/035292 and in Refs. 7 and 8 but without the need to promote phase separation.

Accordingly, in a first preferred aspect, the present invention provides a method for manufacturing a structured polymeric material, the method comprising:

providing a body comprising a precursor polymeric material;

setting up an interference pattern of electromagnetic radiation within the body comprising precursor polymeric material to form a partially cross-linked polymeric material, the interference pattern comprising maxima and minima of intensity of the electromagnetic radiation, the interference pattern thereby causing spatially differential cross linking of the precursor polymeric material to form crosslinked regions having relatively high cross linking density and non-crosslinked regions having relatively low cross linking density, the crosslinked regions and non-crosslinked regions corresponding to the maxima and minima of intensity of the electromagnetic radiation, respectively, contacting the partially cross-linked polymeric material with a solvent to cause expansion and crazing of at least some of the non-crosslinked regions to form a structured polymeric material containing pores, wherein the precursor polymeric material is substantially homogenous.

In a second preferred aspect, the present invention provides a method for manufacturing a structured polymeric material, the method comprising:

providing a body comprising a precursor polymeric material;

selectively exposing a first region of the precursor polymeric material to electromagnetic radiation to form a first interference pattern having a characteristic first periodicity;

selectively exposing a second region of the precursor polymeric material to electromagnetic radiation to form a second interference pattern having a characteristic second periodicity, different to the first periodicity, wherein the first and second interference patterns interact with the precursor polymeric material to form a partially cross-linked polymeric material, each interference pattern comprising maxima and minima of intensity of the electromagnetic radiation, the interference patterns thereby causing spatially differential cross linking of the precursor polymeric material to form crosslinked regions having relatively high cross linking density and non-crosslinked regions having relatively low cross linking density, the crosslinked regions and non-crosslinked regions corresponding to the maxima and minima of intensity of the electromagnetic radiation, respectively, the method further comprising:

contacting the partially cross-linked polymeric material with a solvent to cause expansion and crazing of at least some of the non-crosslinked regions to form a stratified porous structure in the first region having a corresponding first stratified porous structure periodicity, and a stratified porous structure in the second region having a corresponding second stratified porous structure periodicity, different to the first stratified porous structure periodicity.

In a third preferred aspect, the present invention provides a use of a nanoporous material to display an image, the nanoporous material having a plurality of lamellae, adjacent lamellae being spaced apart by an intervening spacing layer wherein the spacing layer comprises an array of spacing elements integrally formed with and extending between the adjacent lamellae, the spacing layer having interconnected porosity extending within the spacing layer, the lamellae and spacing layer operable to reflect illumination light.

In a fourth preferred aspect, the present invention provides a use of a nanoporous material to display an image, the nanoporous material having a plurality of lamellae, adjacent lamellae being spaced apart by an intervening spacing layer wherein the spacing layer comprises an array of spacing elements integrally formed with and extending between the adjacent lamellae, the spacing layer having interconnected porosity extending within the spacing layer, the lamellae and spacing layer operable to reflect illumination light, wherein a first region of the nanoporous material has adjacent lamellae spaced apart by a first characteristic spacing and a second region of the nanoporous material has adjacent lamellae spaced apart by a second characteristic spacing, different to the first characteristic spacing so that the first and second regions display different structural color under white light illumination.

In a fifth preferred aspect, the present invention provides a use of a nanoporous material to conduct a fluid, the nanoporous material having a plurality of lamellae, adjacent lamellae being spaced apart by an intervening spacing layer wherein the spacing layer comprises an array of spacing elements integrally formed with and extending between the adjacent lamellae, the spacing layer having interconnected porosity extending within the spacing layer, the fluid being conducted along the spacing layer.

In a sixth preferred aspect, the present invention provides a use of a nanoporous material to provide a hydrophobic surface, the nanoporous material having a plurality of lamellae, adjacent lamellae being spaced apart by an intervening spacing layer wherein the spacing layer comprises an array of spacing elements integrally formed with and extending between the adjacent lamellae, the spacing layer having interconnected porosity extending within the spacing layer, wherein at least one spacing layer is exposed at the surface of the nanoporous material, the exposed spacing layer providing the hydrophobic surface.

In a seventh preferred aspect, the present invention provides a polymeric structure having a plurality of lamellae, adjacent lamellae being spaced apart by an intervening spacing layer wherein the spacing layer comprises an array of spacing elements integrally formed with and extending between the adjacent lamellae, the spacing layer having interconnected porosity extending within the spacing layer, wherein the lamellae are substantially non-porous.

In an eighth preferred aspect, the present invention provides a polymeric structure having a first region and a second region, adjacent the first region, wherein the first region differs from the second region in that the first region is a nanoporous material having a plurality of lamellae, adjacent lamellae being spaced apart by an intervening spacing layer wherein the spacing layer comprises an array of spacing elements integrally formed with and extending between the adjacent lamellae, the spacing layer having interconnected porosity extending within the spacing layer.

In a ninth preferred aspect, the present invention provides a polymeric structure having a first region and a second region, each having adjacent lamellae spaced apart by an intervening spacing layer wherein the spacing layer comprises an array of spacing elements integrally formed with and extending between the adjacent lamellae, the spacing layer having interconnected porosity extending within the spacing layer, wherein in the first region the adjacent lamellae are spaced apart by a first characteristic spacing and in the second region the adjacent lamellae are spaced apart by a second characteristic spacing, different to the first characteristic spacing so that the first and second regions display different structural color under white light illumination at the same angle of incidence.

In a tenth preferred aspect, the present invention provides a microfluidic device comprising a polymeric structure according to the seventh, eighth or ninth aspect.

In an eleventh preferred aspect, the present invention provides a security document incorporating a polymeric structure according to the seventh, eighth or ninth aspect. The security document may be a banknote or identification label or tag, for example.

Preferred/optional features of the first and second aspect are set out below. These are combinable singly or in any combination with any aspect of the invention, unless the context demands otherwise.

In some embodiments, the precursor polymeric material, at the time of setting up the interference pattern of electromagnetic radiation within the body of precursor polymeric material, consists of a single phase. It is intended that this is one example of a homogeneous precursor polymeric material.

The precursor polymeric material, at the time of setting up the interference pattern of electromagnetic radiation within the body of precursor polymeric material, may comprise one or more homopolymer, one or more copolymer and/or one or more block copolymer.

In some embodiments, the precursor polymeric material substantially does not include block copolymer. Furthermore, it is preferred that the method does not include a step of forming a morphology comprising a three dimensional array of isolated islands in a continuous matrix, the islands being formed of at least one island component of a block copolymer and the matrix is formed of at least one matrix component of the block copolymer. This approach, being the subject of previous work by some of the inventors, is considered to significantly limit the available range of precursor polymeric materials with which the polymeric structure may be produced.

The precursor polymeric material may comprise a photoinitiator, operable to cause cross linking of the precursor polymeric material on exposure to visible light. This is advantageous in that it expands the available range of electromagnetic radiation that may be used in embodiments of the invention, and therefore allows a broader range of periodic structures to be formed in the material.

It is preferred that the precursor polymeric material is a glassy polymeric material. That is, the precursor polymeric material is below its glass transition temperature $T_g$ at least during expansion and crazing of the non-crosslinked regions to form the structured polymeric material containing pores.

The solvent used to cause expansion and crazing may be one that falls outside the Hansen solubility sphere for the precursor polymeric material when plotted in Hansen space but lies close enough to the Hansen solubility sphere for the precursor polymeric material to plasticize and expand the precursor polymeric material. In effect, suitable solvents are those which promote environmental stress cracking of the precursor polymeric material.

In some embodiments, the precursor polymeric material is formed as a layer on a substrate. In this case, a surface of the substrate provides a reflection interface for setting up the interference pattern. The precursor polymeric material may be formed in other formats. For example, the precursor polymeric material may be in the form of particles (e.g. spheres) or rods or fibres (e.g. cylinders).

In some embodiments, a first region of the precursor polymeric material is selectively exposed to the electromagnetic radiation and a second region of the precursor polymeric material is not exposed to the electromagnetic radiation so that the expansion and crazing takes place only in the first region at which there is formed the structured polymeric material containing pores. For example, the second region may be shielded from the electromagnetic radiation by a mask. Additionally or alternatively, the first region may be selectively exposed to the electromagnetic radiation by a laser.

In some embodiments, a first region of the precursor polymeric material is selectively exposed to electromagnetic radiation to form a first interference pattern having a characteristic first periodicity to form a stratified porous structure having a corresponding first periodicity. A second region of the precursor polymeric material may be selectively exposed to electromagnetic radiation to form a second interference pattern having a characteristic second periodicity, different to the first periodicity, to form a stratified porous structure having a corresponding second periodicity.

For example, the first and second interference patterns may be formed by electromagnetic radiation at different angles of incidence, or different wavelengths, or both.

In some embodiments of the seventh, eighth or ninth aspects, the first region may be formed as a track. The first region and the second region may have substantially the same composition.

The polymeric structure may be in the form of a layer, the first and second regions extending through the thickness of the layer.

In some embodiments, the degree of porosity of the spacing layer is greater than that of the lamellae.

In some embodiments, the nanoporous material is a cross linked polymeric material.

In some embodiments, the average thickness of the lamellae in the structure is at least 20 nm. Furthermore, the average thickness of the lamellae in the structure is at most 200 nm. The lamellae in the nanoporous structure may have a periodic spacing of at least 40 nm. The lamellae in the nanoporous structure may have a periodic spacing of at most 1000 nm. The spacing elements may be substantially solid columnar in structure.

Further optional features of the structure are explained below.

The porosity of the spacing layer is interconnected typically in the sense that, within the spacing layer, the porosity extends between adjacent spacing elements. Therefore the spacing layer and adjacent lamellae of the nanoporous material are bicontinuous in the sense that they consist of a matrix material that is bicontinuous with void (interconnected porosity).

Preferably, the degree of porosity of the spacing layer is greater than that of the lamellae. For example, if a notional plane is taken within the plane of a lamella and if a notional plane is taken parallel to this but within the spacing layer, the degree of porosity of each can be estimated by considering the ratio of pore area to the total considered area of the plane. The degree of porosity of the spacing layer on this basis may be at least 1.5 times the degree of porosity of the lamella. More preferably, the degree of porosity of the spacing layer on this basis may be at least 2 times, still more preferably 3 times, 4 times or 5 times the degree of porosity of the lamella. In this consideration, the plane within the spacing layer that provides the maximum degree of porosity may be considered. This is typically located about halfway between adjacent lamellae.

On the same basis as explained in the paragraph above, preferably the degree of porosity of the spacing layer is at least 30%. More preferably, the degree of porosity of the spacing layer is at least 40%, at least 50%, at least 60%, at least 70% or at least 80%. In some embodiments, the degree of porosity can be controlled even after formation of the nanoporous material, as explained in more detail below.

On the same basis as explained in the two paragraphs above, preferably the degree of porosity of the lamella is not more than 10%. More preferably, the degree of porosity of the lamella is not more than 9%, not more than 8%, not more than 7%, not more than 6%, not more than 5%, not more than 4%, not more than 3%, not more than 2%, or not more than 1%. Preferably, the lamella has substantially no porosity.

Preferably, the nanoporous material is formed as a film. The nanoporous material may be formed on a substrate. Preferably, the thickness of the nanoporous material (e.g. the thickness of the film) is at least 40 nm. Where the microstructure is formed due to the formation of an interference pattern in the precursor polymeric material, it is considered that this lower limit for the thickness is required in order to provide the required interference fringes within the precursor polymer material. The thickness of the nanoporous material is preferably at least 50 nm, more preferably at least 60 nm, more preferably at least 70 nm, more preferably at least 80 nm, more preferably at least 90 nm, more preferably at least 100 nm, more preferably at least 150 nm, more preferably at least 200 nm, more preferably at least 250 nm, more preferably at least 300 nm.

There is no particular upper limitation on the thickness of the nanoporous material. Where the microstructure is formed due to the formation of an interference pattern in the precursor polymeric material, the thickness of the precursor polymer material should not be so great as to absorb the electromagnetic radiation to the extent that it is not capable of forming a suitable interference pattern within the material. For many applications, the thickness of the nanoporous material may be at most 1 mm, more preferably at most 500 μm, more preferably at most 400 μm, more preferably at most 300 μm, more preferably at most 200 μm, more preferably at most 100 μm, more preferably at most 50 μm, more preferably at most 40 μm, more preferably at most 30 μm, more preferably at most 20 μm, more preferably at most 10 μm, more preferably at most 5 μm.

It is expressly stated here that a suitable range for the thickness of the nanoporous material may be formed using any combination of the listed preferred lower limits for the thickness with any of the listed preferred upper limits for the thickness.

In some embodiments, the nanoporous material comprises a matrix of the polymeric material. There may be one or more additional materials held within the matrix. In this case, preferably at least 50% by mass of the nanoporous material is formed of the matrix of the polymeric material.

The body comprising precursor polymeric material may be formed as a film or sheet by deposition from a solution. For example, suitable films can be spin-cast. In the case of styrenic polymers, a suitable solvent may comprise toluene.

The precursor polymeric material, before expansion and crazing, may have a thickness in a range formed using any combination of the listed preferred lower limits for the thickness of the nanoporous material with any of the listed preferred upper limits for the thickness of the nanoporous material. However, it should be mentioned here that in view of the expansion caused in the method, the development of the nanoporous material from the precursor polymeric material tends to result in an increase in thickness of nanoporous material compared with the thickness of the precursor polymeric material. This increase in thickness may be at least 5%, for example, more preferably at least 10%, at least 15%, at least 20% or at least 25%, or at least 50%. In one sense, therefore, the nanoporous material can be considered to be an expanded form of the precursor polymeric material, with cross linking.

The average thickness of the lamella in the structure may be at least 1 nm, at least 10 nm, more preferably at least 20 nm, more preferably at least 30 nm, more preferably at least 40 nm and more preferably at least 50 nm. The average thickness of the lamella in the structure may be at most 500 nm, more preferably at most 450 nm, more preferably at most 400 nm, more preferably at most 350 nm, more preferably at most 300 nm, more preferably at most 250 nm, more preferably at most 200 nm. It is expressly stated here that a suitable range for the thickness of the lamella in the structure may be formed using any combination of the listed preferred lower limits for the thickness with any of the listed preferred upper limits for the thickness.

The lamellae in the nanoporous structure may be provided at a characteristic periodic spacing. This characteristic periodic spacing may be at least 2 nm, at least 20 nm, more preferably at least 40 nm, more preferably at least 60 nm, more preferably at least 80 nm and more preferably at least 100 nm. The characteristic periodic spacing of the lamella in the structure may be at most 1000 nm, more preferably at most 900 nm, more preferably at most 800 nm, more preferably at most 700 nm, more preferably at most 600 nm, more preferably at most 500 nm, more preferably at most 400 nm. It is expressly stated here that a suitable range for the spacing of the lamella in the structure may be formed using any combination of the listed preferred lower limits for the spacing with any of the listed preferred upper limits for the spacing.

The spacing layers in the nanoporous structure similarly may have an average thickness of at least 1 nm, at least 10 nm, more preferably at least 20 nm, more preferably at least 30 nm, more preferably at least 40 nm and more preferably at least 50 nm. The average thickness of the spacing layers in the structure may be at most 500 nm, more preferably at most 450 nm, more preferably at most 400 nm, more preferably at most 350 nm, more preferably at most 300 nm, more preferably at most 250 nm, more preferably at most 200 nm. It is expressly stated here that a suitable range for the thickness of the spacing layers in the structure may be formed using any combination of the listed preferred lower limits for the thickness with any of the listed preferred upper limits for the thickness.

The average thickness of the spacing layers may correspond to the height of the spacing elements.

The spacing elements are preferably substantially columnar in structure. More precisely, it is preferred that the spacing elements are substantially catenoidal in structure, in the sense that they are wider close to the lamellae and have a narrowest portion towards the centre of the spacing layer. The spacing elements themselves are preferably solid (i.e. not hollow). The spacing elements are typically formed of the same material as the material of the lamellae.

Other aspects and embodiments of the invention provide the aspects and embodiments described above with the term "comprising" replaced by the term "consisting of" and the aspects and embodiments described above with the term "comprising" replaced by the term "consisting essentially of".

"and/or" where used herein is to be taken as specific disclosure of each of the two specified features or components with or without the other. For example "A and/or B" is to be taken as specific disclosure of each of (i) A, (ii) B and (iii) A and B, just as if each is set out individually herein.

Further optional features of the invention are set out below.

BRIEF DESCRIPTION OF DRAWINGS

Embodiments of the invention will now be described by way of example with reference to the accompanying drawings in which:

FIG. 1 shows cross sectional SEM images of craze lithographic structures formed in a polystyrene film with Phenanthrenequinone (PQ) as a photocrosslinking agent, the film being exposed to different light wavelengths (340, 385, 395, 405 nm, left to right across FIG. 1) before being immersed in glacial acetic acid.

FIG. 2 shows the corresponding structural color for the films shown in FIG. 1.

FIG. 3 plots solvents that enable craze lithography in polystyrene films with respect to the Hansen solubility sphere.

FIG. 4 illustrates how inter-layer distance decreases as molecular weight increases in the craze lithographic structures.

FIG. 5 shows an image of ethanol flowing osmotically along a channel formed by craze lithography.

FIG. 6 shows an image of a mixed solution of rhodamine dye and a 50 nm polystyrene fluorescent colloid flowing along a similar channel to that shown in FIG. 5.

FIG. 7 shows cross sectional SEM images of craze lithographic structures formed in various resists. (a) polystyrene (b) poly 4-chlorostyrene (c) polyfluorostyrene, and (d) styrenic block copolymer, polystyrene-b-poly(acrylic acid). The scale of these images is the same and is shown by a 500 µm scale bar on FIG. 7(a).

FIG. 8 plots intensity of reflection with wavelength of incident light, for craze lithography structures formed with different wavelengths of incident light to generate the interference pattern in the resist.

FIG. 9 plots the Bragg peak wavelength with wavelength of light source for various resist compositions.

FIG. 10 shows a phase diagram of the formation of the craze lithographic structure (also referred to as COS structure) based on composition and molecular weight.

FIG. 11 shows a cross sectional SEM image of a craze lithographic structure formed on an aluminum foil substrate.

FIG. 12 shows a cross sectional SEM image of a craze lithographic structure formed on a mirrored glass substrate.

FIG. 13, left hand image, shows an SEM cross-sectional view of a craze lithographic structure based on polystyrene before etching. The right hand image shows a corresponding structure after etching.

FIG. 14, left hand image, shows an SEM cross-sectional view of a craze lithographic structure based on Poly (penta fluorostyrene) before etching. The right hand image shows a corresponding structure after etching.

FIGS. 15, 16 and 17 summarise three classes of applications of the disclosed material suggested in this work.

FIG. 18 shows a cross sectional SEM image of a craze lithographic structure generated using a laser microbeam.

FIGS. 19-24 illustrate the proposed mechanism for the evolution of the craze lithographic structure.

FIG. 25 further illustrates the craze lithographic process.

FIG. 26 illustrates a modification of FIG. 25, in which a mask or stencil is placed over part of the resist and the remainder of the resist is exposed to incident light.

FIG. 27 illustrates that the craze lithographic structures are not limited to being supported on a reflective surface.

FIG. 28 shows a schematic cross sectional perspective view of a CL channel demonstrating both structural color and microfluidic flow.

FIG. 29 illustrates example images from CAD files of microfluidic patterns to be written into resist.

FIG. 30 shows images of microfluidic patterns corresponding to FIG. 29 having been written into resist and developed by the CL process.

FIG. 31 shows the Hansen parameter plot corresponding to the solvents listed in Table 4 for the development of craze lithography in polystyrene (PS). Dots indicate successful development of craze lithography and crosses indicate unsuccessful development of craze lithography.

FIG. 32 shows the Hansen parameter plot corresponding to the solvents listed in Table 5 for the development of craze lithography in polycarbonate (PC). Dots indicate successful development of craze lithography and crosses indicate unsuccessful development of craze lithography.

FIG. 33 shows the Hansen parameter plot corresponding to the solvents listed in Table 6 for the development of craze lithography in PMMA. Dots indicate successful development of craze lithography and crosses indicate unsuccessful development of craze lithography.

FIG. 34 shows the Hansen parameter plot corresponding to the solvents listed in Table 7 for the development of craze lithography in polysulfone (PSF). Dots indicate successful development of craze lithography and crosses indicate unsuccessful development of craze lithography.

DESCRIPTION OF EMBODIMENTS

Detailed Description of the Preferred Embodiments, and Further Optional Features of the Invention The present disclosure provides a description of a new fundamental structure-formation principle. This is disclosed in order to provide the inventors' clearest thinking, at the time of writing, on the mechanisms considered to be underlying the preferred embodiments of the present invention, without wishing to be bound by theory. In the described embodiments, this mechanism is exploited for generating regular heterogeneous structures via controlled nanoscale explosive fracture.

Some of the preferred embodiments are described in the context of lithographic processing. The conventional concept of lithography is to selectively expose a photosensitive film using a mask, to light, and thereafter remove either the exposed or unexposed region. Herein we report a new approach, which is sometimes referred to herein as "craze lithography", where the exposed area of the films are expanded by photo-induced stress to generate precise three dimensional porous structures that exhibit structured color properties as well as the ability to act as microfluidic channels. The facile technique opens up advances in optical elements and microfluid chips, which are the mainstays of inkless printing, counterfeit technology and medical diagnostics.

Photolithography is the dominant technology to fabricate ultra-fine patterns for semiconductor devices, microelectronics and liquid crystal displays[1]. It also the bedrock of other newer technological advances from microelectromechanical (MEMS) to microfluidic systems. In a typical photolithographical process, a designed pattern is printed on to a photo-sensitive resist and exposed to UV-Visible light or electron beams. Following a chemical or physical development process, the resist is selectively removed and a topographical pattern is generated on a substrate. Classically, resists are termed as either negative or positive[2]. For a negative type resist, the exposed resist survives development, the non-exposed resist being removed. For a positive type resist, the non-exposed resist survives development, the exposed resist being removed. As discussed in more detail below, the approach to craze lithography is similarly to expose part of a polymer layer to electromagnetic radiation and develop the characteristic microstructure only at the exposed part.

There are also significant research efforts to generate three-dimensional structures with the optical characteristics of photonic crystals. However, employing classical lithography of selective material removal within a planar film is limited to layer-by-layer structure development for this purpose[3]. A better route involves the imposition of a 3-D interference pattern within the thin film[4-6], whereby all of the exposed volume of resist material can be removed to develop a photonic structure. Although sophisticated layered photonic structures can be developed in this way, this technique requires precision and indeed it is often difficult to replicate the structures over large areas efficiently.

Here we introduce a broad technology platform via the demonstration of a novel class of photolithography in the preferred embodiments. Craze lithography can generate highly ordered layered porous structures in a polymer film, generating printable areas with pigment-free, structural color. Craze lithography shares similar processes of development steps as classic lithography, i.e. resist-film formation, selective area exposure to light, and subsequent solution development. This therefore allows craze lithography to be adopted easily using existing technological infrastructures.

Craze photolithography is based on the discovery, by some of the inventors and reported previously, that it is possible to generating layered porous structures[7,8]. In the original discovery, such layered structures were formed through highly specific circumstances. Here we report a very substantial broadening of the ranges of materials and situations where such porous layered structures can be formed. This leads to a printing method for photonic crystal type structures that can be applied towards microfluidic chips and also in thin transparent flexible films.

In this disclosure, some of the embodiments are demonstrated using polystyrene (PS), other styrenic based polymers, polycarbonate (PC), poly(methyl methacrylate) (PMMA) and polysulfone (PSF). The inventors have found that even such common polymers are capable of forming highly periodic porous photonic structures through a mechanic crazing process. Crazing is the phenomenon observed during the mechanical deformation of plastic materials[9-11]. In craze lithography, polystyrene films (or a polymer mixture containing styrene, or other suitable polymer) are, similar to classic lithography, deposited on a reflective surface, and then patterned by exposure to light and a solvent. However, during craze lithography, an interference pattern of high and low light intensity is generated within the cross-section of the exposed film due to interference between the incident light and the back reflected light from the substrate. When UV light is used as a source, and polystyrene (PS) is used as the resist, PS undergoes cross-linking at the points of high light intensity.

FIG. 1 shows cross sectional SEM images of craze lithographic structures formed in a polystyrene film with Phenanthrenequinone (PQ) as a photocrosslinking agent, the film being exposed to different light wavelengths (340, 385, 395, 405 nm, left to right across FIG. 1) before being immersed in glacial acetic acid. FIG. 1 shows the increasing period in layers. The SEM image of films have a common magnification (scale bar 500 nm).

An alternative photocrosslinking agent used in this work was 4,4'-bis(diethylamino) benzophenone (BDABP). Although our studies were initiated with PQ, it was found that BDABP could be a more versatile photoinitiator in terms of its miscibility in other polymers and a more efficient adsorption spectrum at high wavelengths leading to lower cross-linking times.

FIG. 2 shows the corresponding structural color for the films shown in FIG. 1. Observation of the films provides visible structural color differences due to the change in lamellar period. The structural color and the lamellar period presents a Bragg peak in specular reflectance that increases with increased initial light wavelength.

It is possible to create an image using the structural color effect. The inventors created a 6 mm square image using a microbeam to write craze-lithographic generated structural color into a 1 μm transparent PS film that was then removed from its original reflective surface and placed on a glass slide for viewing. The image was clearly visible with high definition.

Upon exposure to the developing solvent (described later), the less cross-linked layers within the exposed film become swollen with solvent, hence losing their glassy quality and becoming more mobile. The swelling-induced stress leads to plastic deformation of the intermediate solvent filled layers and is manifested as a crazing-like fibrillation of the intermediate layers. If a free-radical generated photo-crosslinking agent such as Phenanthrenequinone (PQ) is added to the polystyrene[12,13], it is possible for the cross-linking to occur under exposure to high wavelength visible light (as indicated in FIG. 2). Therefore the imposed pattern of high and low cross-linking density areas can be tuned using the incident wavelength of the light through the addition of an appropriate wave-length sensitive photosensitizer.

Environmental Stress Cracks (ESC) are a form of crazing that occurs when a weak solvent is in contact or that has permeated into the material, leading to distortion of the material and eventual crazing. Generally, ESC occurs when the solvent does not dissolve the material but has a weak interaction with it. This is better characterized through the relative energy difference (RED), which is the relative index of the Hansen Solubility parameter and the Hansen solubility sphere[14,15]. From the inventors' experiments, solvents that enable craze lithography in polystyrene films were found to be plotted in a specific narrow region with a certain distance from Hansen solubility sphere, which represents a solvent that dissolves polystyrene in the Hansen solubility space. This is illustrated in FIG. 3.

Thus, it is the inventors' assessment that the formation of the morphologies seen in craze lithography are predictable, for a particular polymer-solvent combination, based on the propensity of the polymer under stress to undergo environmental stress crazing on exposure to the solvent. This is considered by Hansen in Ref 14, where the Hansen Solubility Parameter, the relative energy difference (RED) number and the solvent molar volume (V) are used to help identify the regions where ESC is possible. We quote from a conclusion of this paper:

Plots of RED number versus the molar volume, V, of challenge chemicals are presented as a means to correlate ESC in polymers. There is a region for moderate absorption at intermediate RED numbers on these plots where ESC can occur. At higher RED numbers the amount of absorption is not great enough or else relaxation can preferentially occur at the lower absorption rates. At lower RED numbers the polymer is severely attacked or dissolved. The RED number is derived from differences in HSP between challenge chemical and polymer, so larger RED numbers indicate lesser degrees of equilibrium absorption. V reflects transport (kinetic) phenomena on a relative basis among the tested solvents. Smaller and more linear molecules will diffuse and absorb more rapidly, all other things being equal.

Further guidance on the prediction of ESC in polymers subjected to solvents is set out in Ref. A1.

According to Hansen Solubility Parameter theory, the solubility of a polymer depends on: the energy from dispersion forces between molecules ($\delta D$), the energy from dipolar intermolecular force between molecules ($\delta P$), and the energy from hydrogen bonds between molecules ($\delta H$). These three parameters, $\delta D$, $\delta P$ and $\delta H$ form the three dimensional Hansen solubility space. A solvent is represented as a point in Hansen space and a polymer is described by a sphere with radius Ro.

The molar volume of a solvent is an important parameter for Environmental Stress Crazing (ESC). Solvents with larger molar volume have a lower ability to penetrate polymer networks and have difficulty in inducing ESC. The molar volume of mixed solvents was calculated as the arithmetic average of the component solvents based on the mixing volume ratio.

The Relative Energy Difference (RED) values listed above were calculated according to:

$$R_a^2 = 4(\delta_{D1}-\delta_{D2})^2 + (\delta_{P1}-\delta_{P2})^2 + (\delta_{H1}-\delta_{H2})^2 \quad RED = R_a/R_o \quad [\text{Math.1}]$$

Accordingly, RED and V provide guidance on the selection of suitable polymer and solvent combinations in order to give rise to ESC. It will be appreciated that there is a complex relationship between RED and V and the occurrence of ESC. It is possible to say that the preferred embodiments of the invention use polymer-solvent combinations where the solvent lies between the Hansen solubility sphere for the polymer and the ESC+Hansen solubility sphere for the polymer.

The regions of the film having high cross-linking density (corresponding to the regions of high intensity of the interference pattern) induce stress within the regions of the film having low cross-linking density (corresponding to the regions of low intensity of the interference pattern). These low-cross-linking density regions remain glassy. This is an additional driving force for the expansion and subsequent fibrillization of the low cross-linking density regions once it is given sufficient mobility through the presence of the solvent. The same stress exists in the horizontal plane of the film and can sometimes lead to large scale cracks and buckling in the films. It is notable that the same craze like fibrillation is seen in the interspaces of these large cracks.

When craze lithography is applied using different molecular weights of the polymer, it is found that the inter-layer distance decreases as molecular weight increases (FIG. 4); the observation of longer crazes in low molecular weight materials, especially below the polymer entanglement length is common to stress-induced crazing phenomena.

Some of the most striking features of craze lithographic structures are the layered high refractive index layers, separated by low refractive index regions. These Bragg layers gives rise to a phenomenon of structured color where the resonant reflected color is a function of the separation of the layers, and hence directly related to the wavelength of the cross-linking irradiation. However, polystyrene alone does not cross-link in visible light, so that visible structure color is not possible using polystyrene alone. However, a number of photosensitizers, most notably phenanthrenequinone (PQ), were tested, which are capable of absorption in the visible-light regime to generate cross-linking free-radicals[12,13]. Using PQ as an additive, and irradiating the film with higher wavelengths of light (up to 450 nm), it was possible to create structured porous polymer films with larger periodic spacing that generated vivid, photonic-crystal structural color across the whole visible spectrum from UV to low IR (FIG. 2). Since it is possible to simply alter the wavelength of the irradiating light on the same polymer film, it then becomes possible to generate multiple color printing within the same film. This is different to the case where structural color might be generated by the physical self-assembly of uniformly sized objects such as colloidal crystals[16,17].

Using laser microbeams, it is possible to demonstrate the powerful capability of craze lithography as a printing technology platform. A CAD generated fine pattern, which in this case was an image corresponding to the Vermeer painting "Girl with a pearl earring" was directly written onto a PQ-containing PS film using a 405 nm wavelength laser. In one experiment, a monochrome demonstration as carried out, the image being written into the film using a single laser. However, by using three wavelengths corresponding to RGB, it is possible to print full color on the same polymer film. The present inventors have found that it is possible to generated images with a laser pixellation of 10×10 μm² which corresponds to a 2540 dpi (dots per inch) printing resolution, which is significantly higher than present 350 dpi commercial printing.

Laser microbeam printing of craze lithographic structures is one way to generate very small printed features that have many applications, especially in the area of anticounterfeit printing. However, large area printing is also possible using masking technology and a broad monochromatic light exposure. The present inventors have found that it is possible to print structural color on 6 inch silicon wafers in tens of seconds. Thus, craze lithography offers an alternative, facile, high resolution printing potential.

The internal porosity within the layers creates a unique capability. The porosity between the crosslinked multilayers is continuous within the horizontal planes of the films. Therefore by exposing the polymer films to a circuit-like pattern, it is possible to create fluid channels. This property is highly advantageous in the generation of microfluidic channels. Microfluidic technology is rapidly expanding in the area of low sample volume chemical and biological, synthesis and analysis, especially where low only volumes of samples are available. Since it affords an economic advantage, it is a rapidly growing field[18,19]. Nonetheless, perhaps the single largest obstacle to microfluidic technology is the costly development of the microfluidic device itself. The most common method is the use of classical lithography to transfer a fluidic circuit pattern using a conventional resist into a channelled structure within a glass substrate. A PDMS layer is then bonded over the entire glass plate to create a closed channel circuit[20,21]. This entire multistep process can be circumvented by directly printing a porous channel circuit into a polymer film using craze lithography.

In one experiment, the inventors directly printed a microfluidic channel into a polymer film of thickness about 2 μm. In this approach, there is no need for a separate step to cap the microfluidic channel. The channel height can be freely adjusted by altering the wavelength of irradiating light, so that in principle channel heights can be varied mid-flow.

FIG. 5 shows an image of ethanol flowing osmotically along the channel (scale bar length 100 μm). FIG. 6 shows an image of a mixed solution of rhodamine dye and a 50 nm polystyrene fluorescent colloid flowing along the channel. The image in FIG. 6 was recorded using fluorescent confocal microscopy where the rhodamine and colloid are imaged by excitation at 559 nm and 473 nm respectively.

Craze lithography is possible in resists where there is a possibility to generate photocrosslinking. We have demonstrated that the technique works in other members of the styrenic family included poly(pentafluorostyrene) and Penta (Chlorostyrene). Examples are shown in FIG. 7. This indicates that we can independently alter the mechanical and chemical properties of the porous channels, rendering them for example, more hydrophobic. Therefore the resist might contain additives so long as it does not perturb the overall cross-linking capability through adverse phase separation (see FIG. 10 on PS-PMMA blend). It can equally be generated in copolymeric materials where such phase separation can be more controlled. This craze lithography was also demonstrated in polystyrene-b-polyacrylic acid (PS-b-PAA) generating microfluidic channels with more hydrophilic interiors (FIG. 7).

To this point we have reported structures generated on silicon wafer, which is a convenient reflective surface to work with. So long as a reflection is possible, craze lithography can be developed using any substrate. We have demonstrated the printing process on metal, aluminium foil and glass (FIGS. 11 and 12, respectively).

It is also possible to lift-off the film from the support layer in pure water without destroying the developing structure. So long as the film is thick enough, it can be considered self-standing.

Another feature of craze lithography is that the interlayer is bridged with nm scale pillars. As shown in FIGS. 13 and 14, the columnar structure can be exposed by surface etching and peeling. This structure works as a Cassie state with an air pocket on the surface against wetting and shows super water repellency. Maximum contact angle of 160 degrees was achieved when craze lithography was applied using Poly (2,3,4,5,6-Pentafluorostyrene) (PFS) with water repellency, as a resist. The developing solvent is as described above. Craze lithography combines the advantages of bottom-up self-organization and top-down lithography. This super water repellent structure also makes it easy to increase the area if a large light source is used, and if the properties as lithography are used, it is possible to print a texture of higher order structure having super water repellency on the same surface.

The phenomenon of standing wave interference patterns is in fact well-known and actually hitherto has been considered a significant irritant to the development of good microstructures using classic lithography. It is known to lead to a waviness in the sidewalls of such microstructure[22,23]. Countermeasures to prevent this problem in classic lithography include the use of an anti-reflection film under the resist (Bottom-Anti-Reflective Coating—BARC)[24]. However in our research we have actually taken advantage of these interference patterns to create layered porous structures with high periodicity.

In conclusion of this section, we present craze lithography as a broad platform printing technology. By combining the principle of environmental stress crazing and interference based cross-linking in thin films, we can generate mask or laser patterned layered porous structures in simple homopolymers, as well as more complex chemistries with additional functionalities. The simplest applications reside in ink-free printing at small scales such as is found in an immense anti-counterfeiting industry, or in the facile preparation of microfluidic devices. However, the unique structure developed in craze lithography means that there are applications that take advantage of its mechanical structure or its capabaility to act as a microreactor, or even its possibllity to act as a channel for gases, or liquids or even as optical circuits.

FIGS. 15, 16 and 17 summarise the three classes of applications of the disclosed material suggested in this work. These are structural color, superhydrophobic applications and liquid flow applications, respectively.

Materials and Methods and Further Discussion

Specialty grade polystyrenes (PS, 16, 28, and 160 kDa) were obtained from Polymer Source Inc. (Canada). Commercial grade polystyrenes (35 and 192 kDa), bisphenol A polycarbonate (PC, 45 kDa), poly(methyl methacrylate) (PMMA, 120 kDa), and polysulfone (PSF, 35 kDa) were obtained from Sigma-Aldrich (USA). Photoinitiator 9,10-phenanthrenequinone (PQ) and 4,4'-bis-(diethylamino)-benzophenone (BDABP) were obtained from Tokyo Chemical Industry (Japan) and Sigma-Aldrich, respectively. Solvents n-hexane, toluene, dichloromethane, chloroform, methanol, ethanol, tetrahydrofuran (THF), acetic acid, ethyl acetate and butyl acetate were obtained from Nacalai Tesque (Japan). Solvents 1-propanol, 2-propanol, 1-butanol and acetonitrile; fluorescent dyes Atto-495 and Atto-610; and aluminum oxide powder (brockmann I) were obtained from Sigma-Aldrich. n-hexadecane and fluorescent dye coumarin-153 were obtained from Tokyo Chemical Industry. Polydimethyl siloxane (PDMS) was obtained from Dow Corning (USA). Deionized (DI) water was produced in lab using a Milli-Q Type 1 Ultrapure Water System (Merck-Millipore, USA).

Commercial grade PS, PC, PMMA, and PSF were purified according to the following protocol: 3 g of polymer was dissolved in 50 ml solvent (toluene for PS, chloroform for PC, PMMA and PSF) and sonicated for 30 min at 50° C. The solution was filtered through a 0.2 μm PTFE membrane syringe filter (mdi Membrane Technology Inc., India) with aluminum oxide powder packed in the syringe. The filtrate was mixed with 200 ml DI water in a flask and vigorously shaken for 1 min. The mixture was left to separate for 20 minutes after which the water was drained. The water mixing—draining steps were repeated another 4 times. 200 ml of methanol was added dropwise to the solution to reprecipitate the polymer. The precipitate was filtered (Whatman filter paper, grade 41, USA) for collection. The purified polymer was dried in a vacuum oven for 2 days at 50° C. and stored in a desiccator.

Table 1 shows some exemplary combinations of resists and solvents used for demonstration of craze lithography. The solubility parameters of the mixing solvents, indicated by an asterisk * are summarized in Table 8.

TABLE 1

| Resist | Casting Solvent | Development Solvent |
|---|---|---|
| PS | tolene, chloroform | acetic acid, mixing solvents* |
| PS/PMMA blend | tolene, chloroform | acetic acid, mixing solvents* |
| PS-b-PMMA | tolene, chloroform | acetic acid, mixing solvents* |
| PFS | ButylAcetate or Ethyl Acetate | Ethyl Acetate:MeOH = 2:8 |
| Poly(4-chloro styrene) | toluene | acetic acid |
| PS/PQ | chloroform, dichloromethane | acetic acid, mixing solvents* |
| PS/TX | chloroform | acetic acid, mixing solvents* |
| PS-b-PMMA/PQ | chloroform | acetic acid, mixing solvents* |
| PS/PMMA/PQ | chloroform | acetic acid, mixing solvents* |

Table 2 shows some combinations of polymer, photoinitiator and solvent for spincoating and for micro LED printing.

TABLE 2

| | Polymer (P) | Supplier | Molecular weight (kDa) | Photoinitiator (PI) | Solvent | P conc. (wt %) | P:PI ratio |
|---|---|---|---|---|---|---|---|
| Spin casting | PS | Sigma Aldrich | 192 | BDABP | CHCl$_3$ | 5.0 | 15:1 |
| | | | 192 | BDABP | CH$_2$Cl$_2$ | 5.0 | 15:1 |
| | | | 35 | PQ | CH$_2$Cl$_2$ | 0.5~5.0 | 7.2:1 |
| | | Polymer Source Inc. | 160 | PQ | CH$_2$Cl$_2$ | 2.7 | 7.2:1 |
| | | | 16 | PQ | CH$_2$Cl$_2$ | 3.0 | 7.2:1 |
| | PC | Sigma Aldrich | 45 | BDABP | CHCl$_3$ | 5.0 | 15:1 |
| | PMMA | Sigma Aldrich | 120 | BDABP | CHCl$_3$ | 5.0 | 15:1 |
| | PSF | Sigma Aldrich | 35 | BDABP | CHCl$_3$ | 5.0 | 15:1 |

| | Polymer/Photoinitiator/Solvent | Irradiation dose (J cm$^{-2}$) |
|---|---|---|
| Micro LED printing | PS 35 kDa/PQ/dichloromethane | 500 |
| | PS 192 kDa/BDABP/dichloromethane | 40 |
| | PS 192 kDa/BDABP/chloroform | 160 |

Table 3 shows Hansen parameter calculation details for different polymers and different solvents.

TABLE 3

| Polymer | $\delta_D$ (MPa$^{1/2}$) | $\delta_P$ (MPa$^{1/2}$) | $\delta_H$ (MPa$^{1/2}$) | R$_o$ (MPa$^{1/2}$) |
|---|---|---|---|---|
| PC | 19.1 | 10.9 | 5.1 | 12.1 |
| PS | 22.28 | 5.75 | 4.3 | 12.68 |
| PMMA | 18.64 | 10.52 | 7.51 | 8.59 |
| PSF | 19.7 | 8.3 | 8.3 | 8 |

| | $\delta_D$ (MPa$^{1/2}$) | $\delta_P$ (MPa$^{1/2}$) | $\delta_H$ (MPa$^{1/2}$) | molar volume (cm$^3$/mole) | RED | | | |
|---|---|---|---|---|---|---|---|---|
| | | | | | PC | PS | PMMA | PSF |
| Acetic Acid | 14.5 | 8.0 | 13.5 | 57.2 | 1.06 | 1.44 | 1.23 | 1.45 |
| Ethanol | 15.8 | 8.8 | 19.4 | 58.4 | 1.31 | 1.59 | 1.55 | 1.70 |
| THF | 16.8 | 5.7 | 8.0 | 81.1 | 0.62 | 0.91 | 0.71 | 0.80 |
| Toluene | 18.0 | 1.4 | 2.0 | 106.3 | 0.85 | 0.78 | 1.25 | 1.24 |
| Ethyl Acetate | 15.8 | 5.3 | 7.2 | 98.2 | 0.74 | 1.05 | 0.90 | 1.05 |
| 1-Chloropentane | 16.0 | 6.9 | 1.9 | 121.1 | 0.66 | 1.01 | 0.99 | 1.24 |
| 1-Butanol | 16.0 | 5.7 | 15.8 | 91.5 | 1.11 | 1.34 | 1.27 | 1.36 |
| 2-Propanol (IPA) | 15.8 | 6.1 | 16.4 | 77.0 | 1.15 | 1.40 | 1.33 | 1.43 |
| 1-Propanol | 16.0 | 6.8 | 17.4 | 74.8 | 1.19 | 1.43 | 1.38 | 1.48 |
| Acetonitrile | 15.3 | 18.0 | 6.1 | 52.2 | 0.86 | 1.47 | 1.18 | 1.66 |
| Acetone | 15.5 | 10.4 | 7.0 | 74.0 | 0.62 | 1.15 | 0.73 | 1.09 |
| Methanol | 15.1 | 12.3 | 22.3 | 40.7 | 1.57 | 1.89 | 1.92 | 2.15 |
| Dichloromethane | 18.2 | 6.3 | 6.1 | 63.9 | 0.42 | 0.66 | 0.53 | 0.53 |
| Butyl Acetate | 15.8 | 3.7 | 6.3 | 132.5 | 0.81 | 1.05 | 1.04 | 1.16 |
| Hexane | 14.9 | 0.0 | 0.0 | 131.6 | 1.21 | 1.29 | 1.74 | 1.90 |

Table 4 shows the results of use of different solvents for the development of craze lithography in polystyrene (PS). The corresponding Hansen parameter plot is shown in FIG. 31, in which the numbers assigned to each solvent in Table 4 is shown. Dots indicate successful development of craze lithography and crosses indicate unsuccessful development of craze lithography.

TABLE 4

| No. | Solvent | |
|---|---|---|
| 1 | acetic acid (aa) | • |
| 3 | acetonitrile | x |
| 4 | butanol | x |
| 6 | 1-chloropentane | x |
| 8 | ethanol (EtOH) | x |
| 9 | ethyl acetate | x |
| 12 | 1-propanol | x |
| 13 | 2-propanol | x |
| 14 | THF | x |
| 15 | toluene | x |
| 19 | EtOH/1-chloropentane(9/1, w/w). | • |
| 20 | acetonitrile/1-propanol(1/1, w/w) | x |
| 21 | EtOH/THF(9/1, w/w) | • |
| 22 | ethanol/toluene(9/1, w/w) | • |

Table 5 shows the results of use of different solvents for the development of craze lithography in polycarbonate (PC). The corresponding Hansen parameter plot is shown in FIG. 32, in which the numbers assigned to each solvent in Table 5 is shown. Dots indicate successful development of craze lithography and crosses indicate unsuccessful development of craze lithography.

TABLE 5

| No. | Solvent | |
|---|---|---|
| 1 | acetic acid (aa) | • |
| 2 | acetone | x |
| 5 | butyl acetate | x |
| 7 | dichloromethane | x |
| 8 | ethanol (EtOH) | x |
| 10 | hexane | x |
| 11 | methanol | x |
| 12 | 1-propanol | x |
| 15 | toluene | x |

TABLE 5-continued

| No. | Solvent | |
|---|---|---|
| 17 | acetone/methanol (1/2, 1/3, 3/5, v/v) | • |
| 23 | toluene/methanol(1/5, v/v) | • |

Table 6 shows the results of use of different solvents for the development of craze lithography in PMMA. The corresponding Hansen parameter plot is shown in FIG. 33, in which the numbers assigned to each solvent in Table 6 is shown. Dots indicate successful development of craze lithography and crosses indicate unsuccessful development of craze lithography.

TABLE 6

| No. | Solvent | |
|---|---|---|
| 1 | acetic acid (aa) | x |
| 2 | acetone | x |
| 7 | dichloromethane | x |
| 8 | ethanol | x |
| 9 | ethyl acetate | x |
| 11 | methanol | x |
| 12 | 1-propanol | x |
| 18 | aa/water (6/6, 7/6, 5/3, v/v) | x |
| 18 | aa/water (5/4, 4/3, 3/2, v/v) | • |

Table 7 shows the results of use of different solvents for the development of craze lithography in polysulfone (PSF). The corresponding Hansen parameter plot is shown in FIG. 34, in which the numbers assigned to each solvent in Table 7 is shown. Dots indicate successful development of craze lithography and crosses indicate unsuccessful development of craze lithography.

TABLE 7

| No. | Solvent | |
|---|---|---|
| 1 | acetic acid (aa) | x |
| 2 | acetone | x |
| 7 | dichloromethane | x |
| 9 | ethyl acetate | x |
| 12 | 1-propanol | x |
| 15 | toluene | x |
| 16 | acetone/aa (8/5, 13/5, 20/5, v/v) | • |
| 17 | acetone/methanol(3/2, 15/2, v/v) | x |
| 17 | acetone/methanol(15/9, 15/7, v/v) | • |

1 Craze Lithography Process
Resists and development solvents are listed in Tables 1-8
1-1 Making films
1-1-1 PS
PS (20-35 kDa, Sigma Aldrich) is dissolved into toluene (Aldrich) solution, to form a PS solution of concentration is 5-10 wt %. When the films were subsequently to be exposed to visible light a photo-initiator 7.2 wt % 9,10-Phenanthrenequinone (PQ; Tokyo Chemical Industry) and/or 5 wt % Thioxanethene-9-one (TX; Sigma Aldrich) was mixed into PS chloroform or dichloromethane solution.
1-1-2 Polymer Blends
Polymer blends of Poly styrene (PS) and Poly(methyl methacrylate) (PMMA) consisted of various mixing ratio of PS (35 kDa or 20 kDa, Sigma Aldrich) and PMMA (4 kDa, 8.6 k or 15 kDa, HORIBA STEC). To crosslink PS and degrade PMMA under the visible light, 0.8 wt % 9,10-Phenanthrenequinone (PQ; Tokyo Chemical Industry) or 0.4 wt % Thioxanethene-9-one (TX; Sigma Aldrich) was added into 5 wt % PS/PMMA blend chloroform solution.

1-1-3 Other Homo-Polymers
Butyl Acetate or Ethyl Acetate were used for spincoating solvents of Poly (2,3,4,5,6-Pentafluorostyrene) (PFS) and toluene (Aldrich) for solvent of Poly(4-chloro styrene)
1-2 Spin Coating
Solutions ware spun-cast on a substrate having minor surface such as polished silicon wafer, metals and glass by Spincoater (MS-A100, Mikasa). Spin-casting is known to leave residual stress in the thin films; for clarity, the films are de-stressed by annealing at high temperature (e.g. 190° C. for polystyrene), prior to exposure to electromagnetic radiation for cross linking.
1-3 Crosslinking
Polymer films without added photo-initiator were exposed to UV-light (wavelength of 254 nm; CL-1000, UVP) to carry out cross-linking. Polymer films containing photoinitiator were exposed to visible light generated by LED bulbs (Thorlabs). The wavelength of LED bulb is 285, 300, 340, 375, 385, 395, 405, 420, 455 or 490 nm each. Polymer films containing photo-initiator were alternatively exposed to visible light generated by laser. The beam sizes of the laser were altered by a plano-convex lens and/or the polymer film (such as PS-b-PMMA) were placed beyond the focal distance so that the beam was maximally enlarged to 7 mm×7 mm squares.
For micro pattern printing, films were exposed by LED light source with digital mask (Maskless Lithography tool D-light DL-1000GS/KCH, Nano System solutions) or Laser lithography system (DWL 4000, Heidelberg Instruments Mikrotechnik).
1-4 Development
After PS crosslinking by UV or visible light, the films were developed by immersing in glacial acetic acid or other suitable solvents as identified in Tables 1-8 for 10-180 seconds at room temperature.
2 Analysis
2-1 Structural Analysis
The structure of the resultant craze lithography films was investigated by scanning electron microscopy (FE-SEM; JSM-7500F, JEOL or SU8000, Hitachi were used with a 15.0 kV acceleration voltage) and using a UV-vis spectrometer (MCPD-3700, Otsuka Electronics; with a 210-820 nm light source; MC-2530, Otsuka Electronics).
2-2 Contact Angle
Surface energy was measured by contact angle meter (DSA25S, KRUSS). The peeling process was performed by Scotch Tape or by Reactive ion etcher (RIE-10NR-KF, SAMCO), with a $CF_4$ flow rate of 89 sccm, a pressure of 10 Pa, and a power of 50 W/cm$^2$.
2-3 Flow Detection
For flow channel study, flow of solution was observed by either optical microscope (Axioscope A1 MAT, Carl Zeiss) or confocal microscope (Nikon). Solution was injected from a scratch in the film.
3 Further Discussion
Hansen solubility parameter analysis for craze lithography solvents.
FIG. 3 illustrates the Hansen solubility parameter analysis for craze lithography solvents. Toluene, which is a good solvent on the Hansen space, and mixed solvent which succeeded in development were plotted. The large sphere shows the interaction radius of polystyrene. The hatched dot represents acetic acid and the black dots represent mixed solvent.
If it is wanted to induce craze lithography in polystyrene, as in FIG. 3 it is necessary to use solvents with different solubilities for development compared to solvents that dissolve PS (those that are contained in the large sphere in FIG. 3). That is, although it should not dissolve the film, it is necessary to select a solvent which plasticizes and expands the film. Some mixed solvents used in this work are summarized in Table 8. Solvents that can be used for craze development are found in a relatively narrow range.

TABLE 8

Combination of mixing solvents to generate solvents with altered Hansen solubility parameter.

| Component | ratio | Solubility Parameter | | | radius |
| --- | --- | --- | --- | --- | --- |
| | | δ D | δ p | δ h | |
| Polystyrene | | 22.28 | 5.75 | 4.3 | 12.68 |
| Acetic Acid | | 14.5 | 8 | 13.5 | |
| Methanol/Ethyl Acetate | 8/2 | 15.24 | 10.9 | 19.28 | |
| Methanol/Toluene | 9/1 | 15.39 | 11.21 | 20.27 | |
| Ethanol/1-chloropentane | 9/1 | 15.82 | 8.61 | 17.65 | |
| Ethanol/THF | 9/1 | 15.9 | 8.49 | 18.26 | |
| Ethanol/Toluene | 9/1 | 16.02 | 8.06 | 17.66 | |

Effect of Molecular Weight on Craze Lithography

FIG. 4 shows the variation of periodic spacing seen in the porous structures when different molecular weights of styrenes are used for otherwise identical craze lithographic processing.

The upper gallery of FIG. 4 shows the electron microscope cross-sections of different molecular weights of polystyrene and polyfluorostyrene that have undergone an identical craze lithographic process and have been illuminated with the same initial wavelength (254 nm). Since higher molecular weight polymers are more entangled and mechanically resilient to expansion, the largest degrees of crazing are observed in the low molecular weight samples. This observation is echoed in the spectral reflectance plots of these samples (shown in the lower part of FIG. 4), where the Bragg diffraction peak of the low molecular weight samples is observed at a higher wavelength.

Effect of Polymer Composition on Craze Lithography

FIG. 7 shows cross sectional SEM images of craze lithographic structures observed in styrene homopolymers (polyfluorosytyrene, poly 4-chlorostyrene) and the styrenic block copolymers polystyrene-b-poly(acrylic acid).

FIGS. 8-10 show the use of polymer blends to form craze lithographic structures with polymer blends.

For the samples reported in FIG. 8, microscope images were observed of the reflected color from 1 micron thick polymer blend films containing 82 or 89% of polystyrene (Mw 35 k) and 4 or 5% of PMMA, in addition to 14 or 6% of PQ or TX, respectively. The effect can be achieved with these approximate ratios of either PQ or TX as a photosensitizer. The as-cast films were illuminated with different wavelengths of light from 254 nm to 532 nm, before undergoing development with acetic acid. Changes of structural color were observed, indicating the different expansion of the layers within the craze lithographic structure. This fact is echoed in the plots shown in FIG. 8 where spectral reflectance data of the samples shows a shift in the Bragg diffraction peak from the UV through the visible and towards the IR range of the electromagnetic spectrum. In FIG. 9 the spectral peak of PS/PMMA blend is plotted with the addition of sensitizers PQ and TX in order to shift the structural dimension of the craze lithographic structure from UV to the visible. FIG. 10 shows a phase diagram of craze lithographic structure formation from PS/PMMA blend. The squares and triangles respectively indicate where the COS structure is (squares) and is not (triangles) observed. As explained above, different mixtures of different molecular weights of PS and PMMA were mixed in solution, and the films of these solutions underwent the craze lithographic process. In FIG. 10 the x-axis corresponds to PMMA ratio in the blends. Total molecular weight (Mw) is shown on the y-axis and is the sum of PS and PMMA molecular weight. The solid line is an estimated borderline to guide the eye. Insets (a) and (b) on FIG. 10 show SEM cross-sectional images of a successful craze lithography structure and a failed film from PS/PMMA blend, respectively. The scale bars denote 500 nm. FIG. 10 indicates that it is possible generate craze lithographic structures in polymer mixtures, according to molecular weights and mixing ratios of the components. Indeed it may be that the ability to observe craze lithographic structures is related to the molecular mixing mechanism of the two polymers since the boundary between the craze lithographic structures and non-CL structures is similar in form to the cloud point boundary between miscible and immiscible phases of two component phase diagram.

Effect of Substrate

Craze lithography has been demonstrated also on reflective substrates other than silicon. FIG. 11 shows a cross sectional SEM image of a craze lithographic structure formed on an aluminum foil substrate. FIG. 12 shows a cross sectional SEM image of a craze lithographic structure formed on a mirrored glass substrate. In each of FIGS. 11 and 12, the polymer film was formed using a PS-b-PMMA resist, and the scale bar in each image represents 500 nm.

Super-Hydrophobic Surface

FIGS. 13 and 14 illustrate the use of the material to form highly water repellent surfaces. FIG. 13, left hand image, shows an SEM cross-sectional view of a craze lithographic structure based on polystyrene before etching. The right hand image shows a corresponding structure after etching. The insets in each image show the measurement of contact angle between the surface and a water drop. Before etching, the surface contact angle is 95°. After etching, the contact angle is 140°.

FIG. 14, left hand image, shows an SEM cross-sectional view of a craze lithographic structure based on Poly (penta fluorostyrene) before etching. The right hand image shows a corresponding structure after etching. The insets in each image show the measurement of contact angle between the surface and a water drop. Before etching, the surface contact angle is 105°. After etching, the contact angle is 160°.

Printing Resolution

FIG. 18 shows a cross sectional SEM image of a craze lithographic structure generated using a laser microbeam. The width of the laser microbeam is indicated on the image. FIG. 18 shows that the development of the craze lithographic structure is sharply aligned with the laser microbeam.

Evolution of the Craze Lithographic Structure

FIGS. 19-24 illustrate the proposed mechanism for the evolution of the craze lithographic structure.

It has been noted that craze lithography arises from the interference of back-reflected and incident light leading to a standing wave phenomenon inside the polymer thin film. The separation of planes of equal intensity is given by $\lambda/2n$, where $\lambda$ is the normally incident wavelength in the medium above the thin film. FIG. 20 indicates the general case in which $\theta$ is the incident angle from perpendicular to the substrate plane. n (or $n(\lambda)$) is the wavelength dependent refractive index of the material. FIG. 19 illustrates the situation where the light is incident at an angle normal to the substrate.

It is possible to alter the separation of the planes by altering the incident wavelength, the angle of incidence or the polymer material itself. Normally the medium above the layer is air but it could equally be another medium such as water or oil.

FIG. 20 illustrates the situation where the light is incident at an angle oblique to the substrate. The effect of this is to give rise to a greater degree of separation between the planes.

As shown in FIG. 21, at planes 20 of high light intensity, parallel to the reflective surface, there is strong cross-linking in the film. These planes 20 correspond to the regions of high cross linking density, referred to elsewhere in this disclosure. In planar areas 22 of low light intensity the film is unaffected or has only weak cross-linking density.

As shown in FIG. 22, it is suggested that the formation of regions 20 of high crosslinking density imposes a residual stress within the low cross-linking density regions 22 of the film and creates tiny fractures. However, the material here is essentially glassy so there is no significant crack propagation. The tiny fractures 24 can be considered to be the embryos or seeds for the subsequent craze.

As shown in FIG. 23, upon exposure to a solvent that has a weak interaction with the uncross-linked polymer, to the extent of swelling or plasticization, the solvent permeates into the low density cross-linking regions 22 of the film. This reduces the glass-like properties of the film and allows the crack to propagate in the plane of the film, generating a classic craze-like fibrillation 26 and ultimately leading to a structure as illustrated schematically in FIG. 24 which shows a craze-lithographic morphology of non-porous layers 20*a* of polymer separated by a distance $D = K \cdot \lambda / 2n$ where K represents the expansion in the film due to release of stress and D is the spacing produced after a normally incident light is exposed on the resist.

Environmental Stress cracking (ESC) is a feature most commonly observed in plastics but also affects materials such as metals (for example hydrogen embrittlement). When a plastic under stress is exposed to a weak solvent that is capable of permeation in the polymer, the solvent plasticizes the weakest point of the material, where the stress density is highest, allowing a crack to nucleate and grow. The mode of crack development is through the formation of voids and fibrils in advance of the crack itself. Partial crack development can lead to an extended to an extended series of fibrils. This is illustrated schematically in Ref S1 and is seen experimentally in polyethylene (Ref S2) and in polystyrene (Ref S3). Although crazing and crack formation are generally undesired in plastics, it is a highly prevalent feature of plastics under extended service. However in some cases, ESC is actively promoted to create novel materials. The most famous example is the stretching of polymer films to create well defined fibrils and voids that can be used in membrane technology. Thus the most common membrane separator found in lithium ion batteries is actually a crazed polyethylene sheet.

During standard lithography, a photo resist is exposed to light. The light transmits through the resist and is back reflected from the substrate. Interference between the back reflected light and the incoming light leads to a standing wave inside the film of high and low light intensity. The periodic difference in cross link density leads to an uneven development of the photoresist walls during chemical development. There are many examples of this wavy sidewall development found in the absence of a back antireflection coating (BARC). In order to avoid this effect, BARC coatings are developed which are essentially an additional layer of polymer between the resist and the support. By correctly designing the property of the BARC layer, the light reflected from the support will destructively interfere with the light reflected from the BARC layer, so that there is no back reflected light. See, for example Refs S4 and S5.

The Development of Structural Color of Craze Lithography

FIG. 25 further illustrates the craze lithographic process. A craze lithographic resist 32 such as polystyrene is deposited on a reflective substrate 30 such as Si or metal. The resist is subjected to incident light 34 of wavelength $\lambda_{inc}$ as shown in the left hand part of FIG. 25.

A final structure of the craze lithographic film is shown in the right hand part of FIG. 25 after it has been exposed to light and a developing solution (such as acetic acid). If light is incident upon the craze lithographic film 32*a*, then a particular wavelength of light constructively interferes as a Bragg diffraction peak, which gives the film a distinctive color. Assuming for simplicity an exposure and observation angle of 90°, then the structural color observed has a wavelength of $\lambda_{obs} = K \lambda_{inc} (n_{craze}/n_{resist})$.

FIG. 1 shows the structure seen experimentally via cross-sectional electron microscopy when a polystyrene film with a Phenanthrenequinone (PQ) as a photocrosslinking agent is exposed to different light wavelengths (340, 385, 395, 405 nm) before being immersed in glacial acetic acid. FIG. 1 shows the increasing period in layers through cross-sectional SEM image of the films with a common magnification (scale bar 500 nm). The distinctive structural colors of each of these peaks is indicated in FIG. 2 by the Bragg diffraction peak associated with the structures. This phenomenon is not confined to polystyrene samples. It is also observed in polymer blends containing up to 80% polystyrene and 20% polymethyl methacrylate, as shown in FIG. 8. It is also observed in other blends of polystyrene, and indeed in other polymers capable of craze lithography.

FIG. 26 illustrates a modification of FIG. 25, in which a mask or stencil 33 is placed over part of the resist and the remainder of the resist is exposed to incident light. After development in acetic acid, only the exposed part of the resist develops the craze lithographic structure 32*a*, which in turn means that the structural color effect is only seen at the exposed part of the resist.

An alternative way to print is using a focused light or laser of specific wavelength, power, angle impinging on the resist for a programmable duration and written in a particular pattern. This avoids the need to use a mask or stencil. This has been simply demonstrated by the inventors by drawing a line in a resist (polystyrene). The sample is then subsequently exposed in acetic acid, revealing the drawn structure. More complex structures can be drawn, which can be preprogrammed via a CAD or other graphics file. It is found that these files are faithfully written into the polymer film as structural color. The intensity of the color that can be produced becomes a function of the amount of energy which is deposited via the laser, which is a function of the laser power flux (W/m²), and the duration that the laser exposed on a given area (A). The complexity of the CAD patterns is a subject for the creator, whilst the patterns are faithfully replicated into the resist pattern. Structural colored patterns can be written simultaneously through the use of multiple laser sources of different wavelength and, if necessary, multiple angles of incidence.

FIG. 27 illustrates that the craze lithographic structures are not limited to being supported on a reflective surface. So long as the original resist film is mechanically resilient, it may be removed from the original process by a further step. This step can be by mechanically peeling of the substrate, or by a water displacement method or by another method that results in separation of the resist film from its support. As a demonstration of this, a complex monochromatic image was written onto a thick (2 micron) block copolymer film of Polystyrene-b-Polymethyl methacrylate via the craze lithographic process, where the film was originally spin-coated onto a glass support. After development of the image, the sample was immersed in water, whereby the water invaded the space between the polymer and the support, allowing the polymer film to rest on the water surface. After this, the film was subsequently mechanically picked up on a transparent glass slide for analysis, which showed the image had been faithfully reproduced.

The structural color characteristics of the craze lithography (CL) printing process have been described in detail above. However, it is important to note that the regions where craze lithography exists contains a continuous path (in the plane of the film) of porosity which can be controlled by the craze lithography conditions. Within this porous path, it is possible to incorporate external materials, and/or to induce flow. Therefore it is possible to use the CL process to generate flow circuits such as used in microfluidic devices. In order to demonstrate this, suitable patterns were prepared from CAD files and were faithfully replicated within the resist, and as has been shown in FIGS. 5 and 6, it is possible to demonstrate the flow of liquids through the channels. These liquids can be aqueous or organic, or even of other types, so long as the material that makes up the CL matrix is resilient to them. By the same token it is possible to flow gases through the material and/or also light (using the structure as a fiber optic channel. The key advantage of such channels are that by the CL process, the channels can be formed to be self-enclosed which is a marked deviation from the use of classical lithography to create channels that subsequently require a upper sealing surface to be attached.

FIG. 28 shows a schematic cross sectional perspective view of a CL channel formed of a craze lithographic structure 32a within a resist layer 32 on a reflective substrate 30. This embodiment demonstrates both structural color and microfluidic flow.

FIG. 29 schematically illustrates example images from CAD files of microfluidic patterns to be written into resist. FIG. 30 schematically shows corresponding images of microfluidic patterns having been written into resist and developed by the CL process, indicating the faithful reproduction of the CAD file images.

As already discussed and shown in FIGS. 13 and 14, it is possible to alter the surface energy of the CL surfaces by removal of the upper layer of the CL structures. This can be done by a mechanical peeling or the surface using an adhesive tape, or it can be done more systematically through the use of vapor etching processes. The structure immediately under the CL surface is composed of multiple pillars that generate a surface roughness which increases the water phobicity of the surface. Therefore the use of a patterned CL process, using a mask (such as a circular mask in figure (d), followed by etching of the entire film by reactive ion etching leads to the formation of surface on which the contact angle of water is much higher than on the non-CL surface. This leads to a method for generating superhydrophobic patterns on the film, which have a demonstrated difference in ice-forming or water-repelling properties.

As indicated in FIGS. 15-17, there are multiple possible advantages of the CL structure, which combine the intrinsic CL structure with the ability to print using lithographic techniques, and take advantage of the resulting structure-properties such as superhydrophobicity or structural color, or other properties of the structured material. For example the structure color itself will change as the internal pores become filled with a new material with a different refractive index. Therefore the structures can become useful as sensors based on such filling of the internal pores.

Moreover, the structures can be filled with a reactive substance which can be transformed within the printed structure itself, into a more stable chemical form. For example if the printed lines were filled with a metal precursor (e.g. silver perchlorate ($AgClO_4$)) that can be subsequently reduced to silver metal by UV light (365 nm), then it is possible to create a conductive circuit without the use of a metal vapor deposition process. Therefore it is possible to use such functionalized patterns as sensors. The channels can be used for the generation of porous gas channels, or as conduits for the passage of light therefore creating the possibility of printing fiber-optic circuits using the CL printing process. It should also be noted that the mechanical properties of the CL structures will be different to the non-CL regions adjacent to the printed area. This makes it possible to generate a pattern for directed cracking of a material or preferential absorbance of stress in the printed areas. It should also be noted that once the printed CL circuit has been prepared, it is possible to overlay another resist, and create a second layer of porous circuitry. These two layers can subsequently be joined together at strategic points, thereby creating the possibility to generate a 3 dimensional circuit.

The main described embodiments of the invention are demonstrated in the polystyrene-based polymer system, and additional disclosure is provided in relation to PC, PMMA and PSF polymers. However, it will be understood that the present invention has applicability in a broader compositional space. For example, any commercial negative resist polymer (one that cross-links under exposure to certain light, for example aided by the presence of a photo-initiator) is susceptible to craze lithography when used with a suitable solvent. Examples of such suitable materials include but are not limited to:—

(1) A crosslinking of a polyisoprene rubber by a photo-reactive biazide. (https://en.wikipedia.org/wiki/Photoresist#Negative_photoresist)

(2) SU-8 (an Epoxy-based polymer)

(3) Polyimides (https://www.jstage.jst.go.jp/article/photopolymer/27/2/27_207/_pdf)

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

All references referred to above and/or identified below are hereby incorporated by reference.

LIST OF NON-PATENT DOCUMENT REFERENCES

1. D. G. Bucknall, Nanolithography and Patterning Techniques in Microelectronics: (Woodhead Publishing, 2005)

2. J. V. Crivello, E. Reichmanis, Photopolymer Materials and Processes for Advanced Technologies. Chem. Mater. 26, 533-548 (2014).
3. M. Geissler, Y. Xia, Patterning: Principles and Some New Developments. Adv. Mater. 16, 1249-1269 (2004).
4. Campbell, Sharp, Harrison, Denning, Turberfield, Fabrication of photonic crystals for the visible spectrum by holographic lithography. Nature. 404, 53-6 (2000).
5. S. Jeon et al., Fabricating complex three-dimensional nanostructures with highresolution conformable phase masks. Proc. Natl. Acad. Sci. 101, 12428-12433 (2004).
6. S.-G. Park, M. Miyake, S.-M. Yang, P. V Braun, Cu(2)O inverse woodpile photonic crystals by prism holographic lithography and electrodeposition. Adv. Mater. 23, 2749-52 (2011).
7. P. Zavala-Rivera et al., Collective osmotic shock in ordered materials. Nat. Mater. 11, 53-57 (2012).
8. J. R. C. Smirnov et al., Adaptable Ultraviolet Reflecting Polymeric Multilayer Coatings of High Refractive Index Contrast. Adv. Opt. Mater. 3, 1633-1639 (2015)
9. R. P. Kambour, A Review of Crazing and Fracture in Thermoplastics. J. Polym. Sci. Macromol. Rev. 7, 1-154 (1973).
10. O. J. McGarel, R. P. Wool, Craze growth and healing in polystyrene. J. Polym. Sci. Part B Polym. Phys. 25, 2541-2560 (1987).
11. J. Rottler, M. O. Robbins, Growth, microstructure, and failure of crazes in glassy polymers. Phys. Rev. E. 68, 11801 (2003).
12. N. S. Allen, Photoinitiators for UV and visible curing of coatings: Mechanisms and properties. J. Photochem. Photobiol. A Chem. 100, 101-107 (1996).
13. P. P. A. C. Albuquerque, M. L. Bertolo, L. M. A. Cavalcante, C. Pfeifer, L. F. S. Schneider, Degree of conversion, depth of cure, and color stability of experimental dental composite formulated with camphorquinone and phenanthrenequinone photoinitiators. J. Esthet. Restor. Dent. 27, S49-S57 (2015)
14. C. M. Hansen, On predicting environmental stress cracking in polymers. Polym. Degrad. Stab. 77, 43-53 (2002)
15. M. E. DeRosa, Y. Hong, R. A. Faris, H. Rao, J. Appl. Polym. Sci., in press, doi:10.1002/app.40181.
16. P. Kang, S. O. Ogunbo, D. Erickson, High Resolution Reversible Color Images on Photonic Crystal Substrates. Langmuir. 27, 9676-9680 (2011).
17. H. S. Lee, T. S. Shim, H. Hwang, S.-M. Yang, S.-H. Kim, Colloidal Photonic Crystals toward Structural Color Palettes for Security Materials. Chem. Mater. 25, 2684-2690 (2013).
18. E. K. Sackmann, A. L. Fulton, D. J. Beebe, The present and future role of microfluidics in biomedical research. Nature. 507, 181-189 (2014).
19. T. Tsukahara, K. Mawatari, T. Kitamori, Integrated extended-nano chemical systems on a chip. Chem. Soc. Rev. 39, 1000 (2010)
20. S. K. Sia, G. M. Whitesides, Microfluidic devices fabricated in poly(dimethylsiloxane) for biological studies. Electrophoresis. 24, 3563-3576 (2003).
21. P. Mao, J. Han, Fabrication and characterization of 20 nm planar nanofluidic channels by glass-glass and glass-silicon bonding. Lab Chip. 5, 837 (2005)
22. J. E. Korka, Standing Waves in Photoresists. Appl. Opt. 9, 969 (1970).
23. D. W. Widmann, H. Binder, Linewidth Variations in Photoresist Patterns on Profiled Surfaces. IEEE Trans. Electron Devices. 22, 467-471 (1975).
24. S. H. Hwang, K. K. Lee, J. C. Jung, A novel organic bottom anti-reflective coating material for 193 nm excimer laser lithography. Polymer (Guildf). 41, 6691-6694 (2000)
S1. David Arencon and Jose Ignacio Velasco, Fracture Toughness of Polypropylene-Based Particulate Composites, Materials 2009, 2(4), 2046-2094
S2. Xiaowei Zhang, Elham Sahraei & Kai Wang, Li-ion Battery Separators, Mechanical Integrity and Failure Mechanisms Leading to Soft and Hard Internal Shorts, Scientific Reports volume 6, Article number: 32578 (2016) doi:10.1038/srep32578
S3. Chaitanya K. Desai, A. S. Kumar, S. Basu, V. Parameswaran, Measurement of Cohesive Parameters of Crazes in Polystyrene Films, Experimental and Applied Mechanics, Vol 6, pp 519-526 (2011)
S4. http://slideplayer.com/slide/3826860/
S5. Chris A. Mack, Fundamental Principles of Optical Lithography (2007) Wiley & sons. ISBN: 9780470018934.
A1. Charles M. Hansen, and Lisbeth Just, Prediction of Environmental Stress Cracking in Plastics with Hansen Solubility Parameters, Ind. Eng. Chem. Res., 2001, 40 (1), pp 21-25

The invention claimed is:

1. A method for manufacturing a structured polymeric material by craze lithography, the method comprising:
providing a body comprising a precursor polymeric material;
setting up an interference pattern of electromagnetic radiation within the body comprising precursor polymeric material to form a partially cross-linked polymeric material, the interference pattern comprising maxima and minima of intensity of the electromagnetic radiation, the interference pattern thereby causing spatially differential cross linking of the precursor polymeric material to form crosslinked regions having relatively high cross linking density and non-crosslinked regions having relatively low cross linking density, the crosslinked regions and non-crosslinked regions corresponding to the maxima and minima of intensity of the electromagnetic radiation, respectively,
contacting the partially cross-linked polymeric material with a solvent to cause expansion and crazing of at least some of the non-crosslinked regions to form a structured polymeric material containing pores,
wherein the solvent used to cause expansion and crazing falls outside a Hansen solubility sphere for the precursor polymeric material when plotted in Hansen space but lies close enough to the Hansen solubility sphere for the precursor polymeric material to expand and craze the precursor polymeric material, and
wherein the precursor polymeric material is substantially homogeneous.

2. The method according to claim 1 wherein the precursor polymeric material consists of a single phase.

3. The method according to claim 1 wherein the precursor polymeric material comprises one or more homopolymer, one or more copolymer and/or one or more block copolymer.

4. The method according to claim 1 wherein the precursor polymeric material comprises a photo-initiator, operable to cause cross linking of the precursor polymeric material on exposure to visible light.

5. The method according to claim 1 wherein the precursor polymeric material is formed as a layer on a substrate, a surface of the substrate providing a reflection interface for setting up the interference pattern.

6. The method according to claim 1 wherein a first region of the precursor polymeric material is selectively exposed to the electromagnetic radiation and a second region of the precursor polymeric material is not exposed to the electromagnetic radiation so that the expansion and crazing takes place only in the first region at which there is formed the structured polymeric material containing pores.

7. The method according to claim 6 wherein the second region is shielded from the electromagnetic radiation by a mask.

8. The method according to claim 6 wherein the first region is selectively exposed to the electromagnetic radiation by a laser.

9. The method according to claim 1 wherein a first region of the precursor polymeric material is selectively exposed to electromagnetic radiation to form a first interference pattern having a characteristic first periodicity to form a stratified porous structure having a corresponding first periodicity, and a second region of the precursor polymeric material is selectively exposed to electromagnetic radiation to form a second interference pattern having a characteristic second periodicity, different to the first periodicity.

10. A method for manufacturing a structured polymeric material by craze lithography, the method comprising:
providing a body comprising a precursor polymeric material;
selectively exposing a first region of the precursor polymeric material to electromagnetic radiation to form a first interference pattern having a characteristic first periodicity;
selectively exposing a second region of the precursor polymeric material to electromagnetic radiation to form a second interference pattern having a characteristic second periodicity, different to the first periodicity,
wherein the first and second interference patterns interact with the precursor polymeric material to form a partially cross-linked polymeric material, each interference pattern comprising maxima and minima of intensity of the electromagnetic radiation, the interference patterns thereby causing spatially differential cross linking of the precursor polymeric material to form crosslinked regions having relatively high cross linking density and non-crosslinked regions having relatively low cross linking density, the crosslinked regions and non-crosslinked regions corresponding to the maxima and minima of intensity of the electromagnetic radiation, respectively,
the method further comprising:
contacting the partially cross-linked polymeric material with a solvent to cause expansion and crazing of at least some of the non-crosslinked regions to form a stratified porous structure in the first region having a corresponding first stratified porous structure periodicity, and a stratified porous structure in the second region having a corresponding second stratified porous structure periodicity, different to the first stratified porous structure periodicity,
wherein the solvent used to cause expansion and crazing falls outside a Hansen solubility sphere for the precursor polymeric material when plotted in Hansen space but lies close enough to the Hansen solubility sphere for the precursor polymeric material to expand and craze the precursor polymeric material.

11. The method according to claim 10 wherein the first and second interference patterns are formed by electromagnetic radiation at different angles of incidence, or different wavelengths, or both.

* * * * *